(12) United States Patent
Hwang et al.

(10) Patent No.: US 12,727,492 B2
(45) Date of Patent: Sep. 1, 2026

(54) SEMICONDUCTOR PACKAGE

(71) Applicant: Samsung Electronics Co., Ltd., Suwon-si (KR)

(72) Inventors: Hyeon Jeong Hwang, Suwon-si (KR); Geun Woo Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 357 days.

(21) Appl. No.: 18/228,209

(22) Filed: Jul. 31, 2023

(65) Prior Publication Data

US 2024/0203854 A1 Jun. 20, 2024

(30) Foreign Application Priority Data

Dec. 14, 2022 (KR) ........................ 10-2022-0174472

(51) Int. Cl.

*H01L 23/498* (2006.01)
*H10W 70/63* (2026.01)
*H10W 74/10* (2026.01)
*H10W 90/00* (2026.01)
*H10W 90/20* (2026.01)

(52) U.S. Cl.

CPC ........ *H10W 70/635* (2026.01); *H10W 74/117* (2026.01); *H10W 90/00* (2026.01); *H10W 90/297* (2026.01); *H10W 90/722* (2026.01); *H10W 90/724* (2026.01); *H10W 90/732* (2026.01); *H10W 90/734* (2026.01)

(58) Field of Classification Search

None

See application file for complete search history.

(56) References Cited

U.S. PATENT DOCUMENTS 8,349,649 B2 1/2013 Kurita
9,516,740 B2 12/2016 Lee et al.
9,601,471 B2 3/2017 Zhai et al.
10,446,520 B2 * 10/2019 Jeng ...................... H10W 90/00
10,546,844 B2 * 1/2020 Kim ...................... H10W 90/00

(Continued)

FOREIGN PATENT DOCUMENTS

KR 1020140001085 A 1/2014
KR 1020160032182 A 3/2016

(Continued)

*Primary Examiner* — Long Pham

(74) *Attorney, Agent, or Firm* — Muir Patent Law, PLLC

(57) ABSTRACT

A semiconductor package an interposer disposed on a substrate, a recess recessed from an upper surface of the interposer, a connection structure disposed inside the recess, a first post disposed on the upper surface of the interposer and electrically connected to the interposer, a second post disposed on an upper surface of the connection structure and electrically connected to the connection structure, a first lower semiconductor chip disposed between the first and second posts and disposed on the upper surface of the interposer and the upper surface of the connection structure. The first lower semiconductor chip is electrically connected to the second post through the connection structure, and a first upper semiconductor chip is disposed on an upper surface of the first lower semiconductor chip. The first upper semiconductor chip is electrically connected to the first lower semiconductor chip through the second post and the connection structure.

20 Claims, 23 Drawing Sheets

(56) References Cited

U.S. PATENT DOCUMENTS

| | | | | |
|---|---|---|---|---|
| 10,559,525 | B2 | 2/2020 | Yu | |
| 10,950,550 | B2 | 3/2021 | Qian et al. | |
| 11,373,955 | B2 | 6/2022 | Joo et al. | |
| 11,876,083 | B2 * | 1/2024 | Kim | H10W 70/614 |
| 12,136,597 | B2 * | 11/2024 | Tsai | H10W 70/614 |
| 12,568,865 | B2 * | 3/2026 | Kim | H10W 90/00 |
| 2017/0207197 | A1 * | 7/2017 | Yu | H10W 90/00 |
| 2020/0258847 | A1 * | 8/2020 | Pietambaram | H10W 42/121 |
| 2020/0364600 | A1 * | 11/2020 | Elsherbini | G06N 10/40 |
| 2021/0265275 | A1 | 8/2021 | Rubin et al. | |
| 2021/0407962 | A1 * | 12/2021 | Kim | H10W 90/00 |
| 2022/0181303 | A1 * | 6/2022 | Lee | H10W 70/614 |
| 2023/0065366 | A1 * | 3/2023 | Kim | H10W 72/00 |
| 2023/0065378 | A1 * | 3/2023 | Kim | H10W 90/00 |

FOREIGN PATENT DOCUMENTS

| | | | |
|---|---|---|---|
| KR | 1020160085197 | A | 7/2016 |
| KR | 1020180070286 | A | 6/2018 |
| KR | 1020200132512 | A | 11/2020 |

* cited by examiner

SEMICONDUCTOR PACKAGE

CROSS-REFERENCE TO RELATED APPLICATION

This application claims priority from Korean Patent Application No. 10-2022-0174472 filed on Dec. 14, 2022 in the Korean Intellectual Property Office and all the benefits accruing therefrom under 35 U.S.C. 119, the contents of which in its entirety are herein incorporated by reference.

BACKGROUND

Technical Field

The present disclosure relates to a semiconductor package.

Description of the Related Art

Recently, as implementation of high performance devices is desirable, a size of a semiconductor chip is increased and a size of a semiconductor package is correspondingly increased. On the other hand, a thickness of the semiconductor package is rather reduced in accordance with the slimness tendency of an electronic device.

The semiconductor package has been developed to satisfy multi-function, high capacity, and miniaturization requirements. To this end, multiple semiconductor chips have been integrated into one semiconductor package so that the size of the semiconductor package has been remarkably reduced and high capacity and multi-function have been performed. In response to such a development trend of the semiconductor package, studies for improving reliability in a connection relation between the multiple semiconductor chips while miniaturizing the semiconductor package are ongoing.

BRIEF SUMMARY

An object of the present disclosure is to provide a semiconductor package in which reliability in a connection relation between a plurality of upper and lower semiconductor chips stacked vertically is improved.

According to some embodiments of the present disclosure, a semiconductor package includes a substrate, an interposer disposed on the substrate, a recess recessed from an upper surface of the interposer toward the inside of the interposer, a connection structure disposed inside the recess, a first post extending in a vertical direction that is perpendicular to an upper surface of the substrate and disposed on the upper surface of the interposer, wherein the first post is electrically connected to the interposer, a second post extending in the vertical direction and disposed on an upper surface of the connection structure, wherein the second post is electrically connected to the connection structure, a first lower semiconductor chip disposed in a space between the first post and the second post and disposed on the upper surface of the interposer and the upper surface of the connection structure, wherein the first lower semiconductor chip is electrically connected to the second post through the connection structure, and a first upper semiconductor chip disposed on an upper surface of the first lower semiconductor chip, wherein the first upper semiconductor chip is electrically connected to the first lower semiconductor chip through the second post and the connection structure.

According to some embodiments of the present disclosure, a semiconductor package includes a substrate, an interposer disposed on the substrate, a recess recessed from an upper surface of the interposer toward the inside of the interposer, a connection structure disposed inside the recess, wherein the connection structure is spaced apart from the interposer in a first horizontal direction that is parallel to an upper surface of the substrate, a first molding layer disposed inside the recess, wherein the first molding layer is disposed in a space between the interposer and the connection structure, a first redistribution structure disposed on each of the upper surface of the interposer and an upper surface of the connection structure, wherein the first redistribution structure is electrically connected to each of the interposer and the connection structure, a first lower semiconductor chip disposed on an upper surface of the first redistribution structure, wherein the first lower semiconductor chip overlaps each of the interposer and the connection structure in a vertical direction that is perpendicular to the upper surface of the substrate, and wherein the first lower semiconductor chip is electrically connected to the connection structure through the first redistribution structure, a second lower semiconductor chip disposed on the upper surface of the first redistribution structure, wherein the second lower semiconductor chip is spaced apart from the first lower semiconductor chip in the first horizontal direction, wherein the second lower semiconductor chip overlaps each of the interposer and the connection structure in the vertical direction, and wherein the second lower semiconductor chip is electrically connected to the connection structure through the first redistribution structure, a post disposed on the upper surface of the first redistribution structure, wherein the post is disposed in a space between the first lower semiconductor chip and the second lower semiconductor chip, wherein the post extends in the vertical direction, and wherein the post is electrically connected to the connection structure through the first redistribution structure, and a first upper semiconductor chip disposed on an upper surface of the first lower semiconductor chip, wherein the first upper semiconductor chip is electrically connected to the first lower semiconductor chip through the post and the connection structure.

According to some embodiments of the present disclosure, a semiconductor package includes a substrate, an interposer disposed on the substrate, a recess recessed from an upper surface of the interposer toward the inside of the interposer, a connection structure disposed inside the recess, wherein the connection structure is spaced apart from the interposer in a first horizontal direction that is parallel to an upper surface of the substrate and includes a base material layer and a connection wiring pattern disposed inside the base material layer, and wherein the base material layer includes silicon (Si), and the connection wiring pattern includes a conductive material, a first molding layer disposed inside the recess and in a space between the interposer and the connection structure, wherein an upper surface of the first molding layer is coplanar with the upper surface of the interposer, and wherein a lower surface of the first molding layer is coplanar with a lower surface of the interposer, a first redistribution structure disposed on each of the upper surface of the interposer and an upper surface of the connection structure, wherein the first redistribution structure is electrically connected to each of the interposer and the connection structure, a first post extending in a vertical direction that is perpendicular to the upper surface of the substrate and disposed on an upper surface of the first redistribution structure, wherein the first post is electrically connected to the interposer through the first redistribution structure, a second post extending in the vertical direction and disposed on the upper surface of the first redistribution structure, wherein the second post is electrically connected to the connection structure through the first redistribution structure, a first lower semiconductor chip disposed on the upper surface of the first redistribution structure, wherein the first lower semiconductor chip is disposed between the first post and the second post, and wherein the first lower semiconductor chip is electrically connected to the second post through the first redistribution structure and the connection structure, a second lower semiconductor chip disposed on the upper surface of the first redistribution structure, wherein the second lower semiconductor chip is spaced apart from the second post in the first horizontal direction, and wherein the second lower semiconductor chip is electrically connected to the second post through the first redistribution structure and the connection structure, a second molding layer surrounding each of the first lower semiconductor chip and the second lower semiconductor chip, wherein the first post and the second post penetrate the second molding layer, and wherein an upper surface of the second molding layer is higher than an upper surface of each of the first and second lower semiconductor chips, a second redistribution structure disposed on the upper surface of the second molding layer, wherein the second redistribution structure is electrically connected to each of the first post and the second post, and an upper semiconductor chip disposed on an upper surface of the second redistribution structure, wherein the upper semiconductor chip is electrically connected to the first lower semiconductor chip through the second redistribution structure, the second post and the connection structure.

The objects of the present disclosure are not limited to those mentioned above and additional objects of the present disclosure, which are not mentioned herein, will be clearly understood by those skilled in the art from the following description of the present disclosure.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE DISCLOSURE

Hereinafter, a semiconductor package according to some embodiments of the present disclosure will be described with reference to FIGS. 1 and 2.

Figure 1:
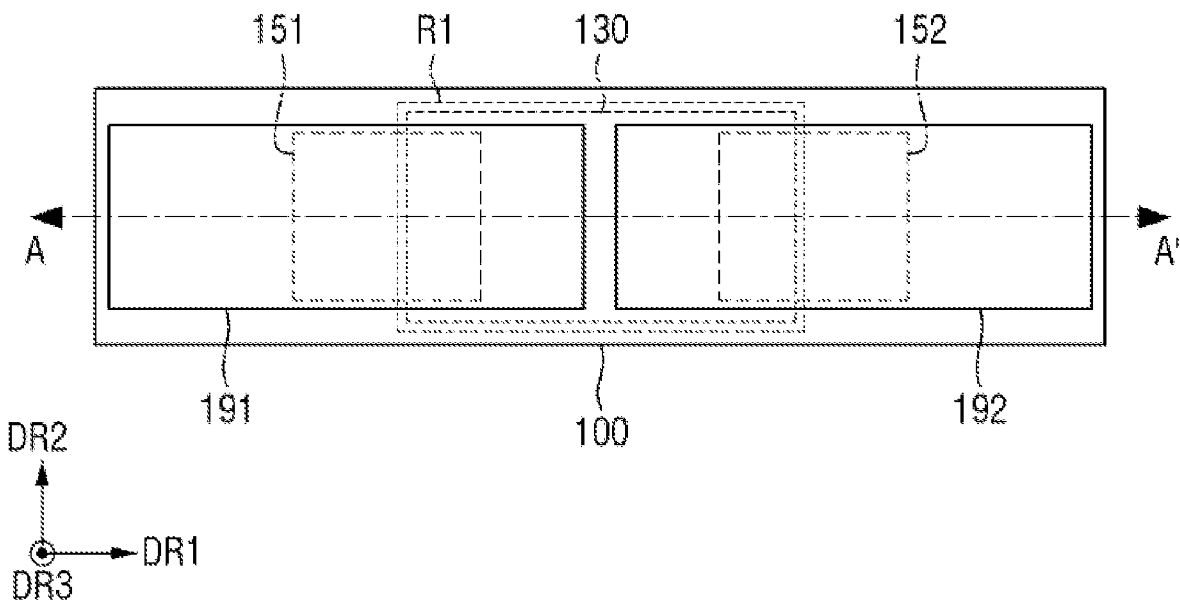
FIG. 1 is a schematic plan view illustrating a semiconductor package according to some embodiments of the present disclosure.

FIG. 1 is a schematic plan view illustrating a semiconductor package according to some embodiments of the present disclosure. FIG. 2 is a cross-sectional view taken along line A-A' of FIG. 1.

Figure 2:
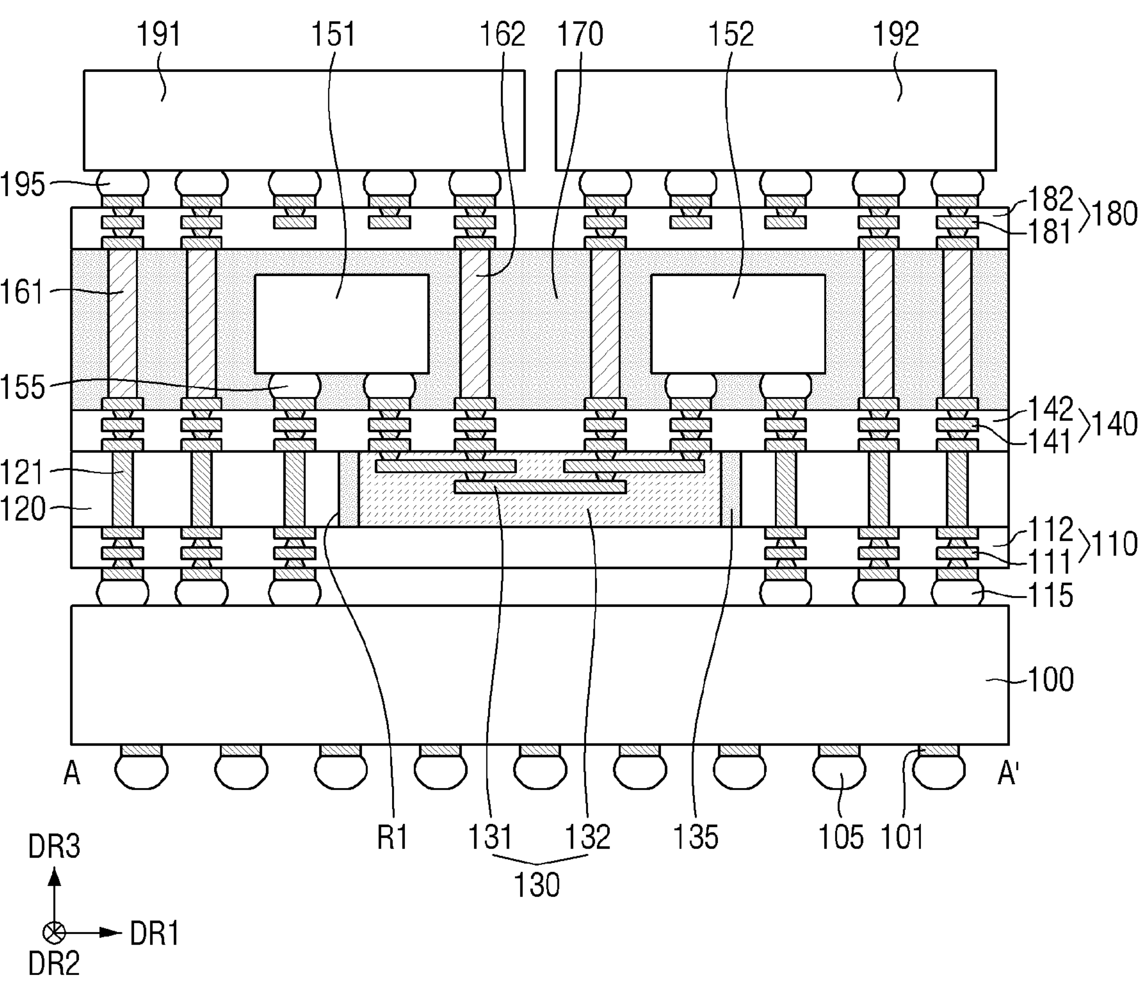
FIG. 2 is a cross-sectional view taken along line A-A' of FIG. 1.

Referring to FIGS. 1 and 2, the semiconductor package according to some embodiments of the present disclosure includes a substrate 100, a conductive pad 101, a first solder ball 105, a first redistribution structure 110, a second solder ball 115, an interposer 120, a connection structure 130, a first molding layer 135, a second redistribution structure 140, a first lower semiconductor chip 151, a second lower semiconductor chip 152, a third solder ball 155, a first post 161, a second post 162, a second molding layer 170, a third redistribution structure 180, a first upper semiconductor chip 191, a second upper semiconductor chip 192, and a fourth solder ball 195. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. A term that is referenced with a particular ordinal number (e.g., "first" in a particular claim) may be described elsewhere with a different ordinal number (e.g., "second" in the specification or another claim).

The substrate 100 may be, for example, a printed circuit board (PCB) or a ceramic substrate, but the present disclosure is not limited thereto. When the substrate 100 is a printed circuit board, the substrate 100 may be made of at least one material selected from a phenol resin, an epoxy resin, and polyimide. For example, the substrate 100 may include or may be formed of at least one material selected from FR4 (or FR-4), tetrafunctional epoxy, polyphenylene ether, epoxy/polyphenylene oxide, bismaleimide triazine (BT), thermount, cyanate ester, polyimide, and liquid crystal polymer.

Hereinafter, each of a first horizontal direction DR1 and a second horizontal direction DR2 may be defined as a direction parallel with an upper surface of the substrate 100. The second horizontal direction DR2 may be defined as a direction perpendicular to the first horizontal direction DR1. A vertical direction DR3 may be defined as a direction perpendicular to each of the first horizontal direction DR1 and the second horizontal direction DR2. The vertical direction DR3 may be defined as a direction perpendicular to the upper surface of the substrate 100.

The conductive pad 101 may be disposed on a lower surface of the substrate 100. For example, the conductive pad 101 may protrude from the lower surface of the substrate 100, but the present disclosure is not limited thereto. In some embodiments, the conductive pad 101 may be buried in the substrate 100. The conductive pad 101 may include or may be formed of a conductive material.

The first solder ball 105 may be disposed on the lower surface of the substrate 100. The first solder ball 105 may be connected to the conductive pad 101. The first solder ball 105 may protrude to be convex from the conductive pad 101. The first solder ball 105 of the substrate 100 may be electrically connected to another external device. The first solder ball 105 may include or may be formed of a conductive material. The first solder ball 105 may include or may be formed of at least one of, for example, tin (Sn), indium (In), lead (Pb), zinc (Zn), nickel (Ni), gold (Au), silver (Ag), copper (Cu), antimony (Sb), bismuth (Bi), and a combination thereof, but the present disclosure is not limited thereto.

The first redistribution structure 110 may be disposed on the upper surface of the substrate 100. The first redistribution structure 110 may include a first redistribution pattern 111 and a first insulating layer 112. The first redistribution pattern 111 may be disposed inside the first insulating layer 112. For example, the first redistribution pattern 111 may include a plurality of wires spaced apart from each other in the first horizontal direction DR1 and the second horizontal direction DR2. The first redistribution pattern 111 may include a plurality of wires spaced apart from each other in the vertical direction DR3. For example, some of the first redistribution patterns 111 may protrude from a lower surface of the first insulating layer 112, but the present disclosure is not limited thereto.

The first redistribution pattern 111 may include or may be formed of a conductive material. The first redistribution pattern 111 may include or may be formed of at least one of, for example, copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), aluminum (Al), and zirconium (Zr). The first insulating layer 112 may include or may be formed of an insulating material. The first insulating layer 112 may include or may be formed of, for example, a photo imageable dielectric (PID). In some embodiments, the first insulating layer 112 may include or may be formed of a photosensitive insulating material. The first insulating layer 112 may include or may be formed of, for example, an epoxy resin or polyimide, but the present disclosure is not limited thereto.

The second solder ball 115 may be disposed on a lower surface of the first redistribution structure 110. The second solder ball 115 may be connected to the first redistribution pattern 111 formed on the lower surface of the first insulating layer 112. The first redistribution structure 110 may be connected to the upper surface of the substrate 100 through the second solder ball 115. In some embodiments, the first redistribution pattern 111 may be electrically connected to a wiring pattern disposed on the substrate 100 through the second solder ball 115. The second solder ball 115 may include or may be formed of a conductive material. The second solder ball 115 may include or may be formed of at least one of tin (Sn), indium (In), lead (Pb), zinc (Zn), nickel (Ni), gold (Au), silver (Ag), copper (Cu), antimony (Sb), bismuth (Bi), and a combination thereof, but the present disclosure is not limited thereto.

The interposer 120 may be disposed on an upper surface of the first redistribution structure 110. A recess R1 may be formed inside the interposer 120. For example, the recess R1 may be formed in a central area of the interposer 120. For example, a sidewall of the recess R1 may be surrounded by an inner sidewall of the interposer 120. The recess R1 may be formed to be recessed from an upper surface of the interposer 120 toward the inside of the interposer 120. In some embodiments, the recess R1 may completely pass through the interposer 120 in the vertical direction DR3. For example, the recess R1 may correspond to an opening of the interposer 120 to accommodate the connection structure 130.

A plurality of through vias 121 may pass through the inside of the interposer 120 in the vertical direction DR3. For example, upper surfaces of the plurality of through vias 121 may be exposed at the upper surface of the interposer 120. Lower surfaces of the plurality of through vias 121 may be exposed at a lower surface of the interposer 120. For example, the plurality of through vias 121 are not disposed inside the recess R1. The plurality of through vias 121 may include or may be formed of a conductive material.

The connection structure 130 may be disposed inside the recess R1. For example, a sidewall of the connection structure 130 may be spaced apart from the interposer 120 in the first horizontal direction DR1. Although not shown, a sidewall of the connection structure 130 may be spaced apart from the interposer 120 in the second horizontal direction DR2. For example, an upper surface of the connection structure 130 may be formed on the same plane as (i.e., may be coplanar with) the upper surface of the interposer 120. A lower surface of the connection structure 130 may be formed on the same plane as the lower surface of the interposer 120.

The connection structure 130 may include a connection wiring pattern 131 and a base material layer 132. For example, an upper surface of the base material layer 132 may be formed on the same plane as the upper surface of the interposer 120. A lower surface of the base material layer 132 may be formed on the same plane as the lower surface of the interposer 120. For example, the base material layer 132 may include or may be formed of a semiconductor material. The base material layer 132 may include or may be formed of, for example, silicon (Si).

The connection wiring pattern 131 may be disposed inside the base material layer 132. For example, the connection wiring pattern 131 may include a plurality of wirings spaced apart from each other in the first horizontal direction DR1 and the second horizontal direction DR2. The connection wiring pattern 131 may include a plurality of wirings spaced apart from each other in the vertical direction DR3. For example, some of the connection wiring patterns 131 may be exposed at the upper surface of the base material layer 132. The connection wiring pattern 131 may include or may be formed of a conductive material. The connection wire pattern 131 may include or may be formed of at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), aluminum (Al), and zirconium (Zr).

The first molding layer 135 may be disposed inside the recess R1, and may be disposed between the connection structure 130 and the interposer 120. For example, an upper surface of the first molding layer 135 may be formed on the same plane as each of the upper surface of the interposer 120 and the upper surface of the connection structure 130. A lower surface of the first molding layer 135 may be formed on the same plane as each of the lower surface of the interposer 120 and the lower surface of the connection structure 130. The first molding layer 135 may include or may be formed of, for example, a film-type photo-imageable encapsulant (PIE), an epoxy molding compound (EMC) or a silicon hybrid material of at least two kinds as a base material.

The second redistribution structure 140 may be disposed on each of the upper surface of the interposer 120, the upper surface of the connection structure 130 and the upper surface of the first molding layer 135. The second redistribution structure 140 may be electrically connected to each of the interposer 120 and the connection structure 130. The second redistribution structure 140 may include a second redistribution pattern 141 and a second insulating layer 142. The second redistribution pattern 141 may be disposed inside the second insulating layer 142. For example, the second redistribution pattern 141 may include a plurality of wires spaced apart from each other in the first horizontal direction DR1 and the second horizontal direction DR2. The second redistribution pattern 141 may include a plurality of wires spaced apart from each other in the vertical direction DR3. For example, a portion of the second redistribution patterns 141 may protrude from the upper surface of the second insulating layer 142, but the present disclosure is not limited thereto.

The second redistribution pattern 141 may include or may be formed of a conductive material. The second redistribution pattern 141 may include or may be formed of at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), aluminum (Al), and zirconium (Zr). The second insulating layer 142 may include or may be formed of an insulating material. The second insulating layer 142 may include or may be formed of, for example, a photo imageable dielectric (PID). In some embodiments, the second insulating layer 142 may include or may be formed of a photosensitive insulating material. The first insulating layer 112 may include or may be formed of, for example, an epoxy resin or polyimide, but the present disclosure is not limited thereto.

The plurality of first posts 161 may be disposed on an upper surface of the second redistribution structure 140. For example, the plurality of first posts 161 may be disposed on an upper surface of an edge portion of the second redistribution structure 140. The plurality of first posts 161 may extend in the vertical direction DR3. For example, the plurality of first posts 161 may overlap the interposer 120 in the vertical direction DR3. The plurality of first posts 161 may be connected to the second redistribution structure 140. For example, the plurality of first posts 161 may be electrically connected to the interposer 120 through the second redistribution structure 140. The plurality of first posts 161 may include or may be formed of a conductive material.

The plurality of second posts 162 may be disposed on the upper surface of the second redistribution structure 140. For example, the plurality of second posts 162 may be disposed on an upper surface of a central portion of the second redistribution structure 140. For example, the plurality of second posts 162 may be spaced apart from the plurality of first posts 161 in the first horizontal direction DR1. Although not shown, the plurality of second posts 162 may be spaced apart from the plurality of first posts 161 in the second horizontal direction DR2. The plurality of second posts 162 may extend in the vertical direction DR3. For example, the plurality of second posts 162 may overlap the connection structure 130 in the vertical direction DR3. The plurality of second posts 162 may be connected to the second redistribution structure 140. For example, the plurality of second posts 162 may be electrically connected to the connection structure 130 through the second redistribution structure 140. The plurality of second posts 162 may include or may be formed of a conductive material.

The first lower semiconductor chip 151 may be disposed on the upper surface of the second redistribution structure 140. The first lower semiconductor chip 151 may be disposed between the first post 161 and the second post 162. For example, the first lower semiconductor chip 151 may be spaced apart from each of the first post 161 and the second post 162 in the first horizontal direction DR1. For example, the first lower semiconductor chip 151 may overlap each of the interposer 120 and the connection structure 130 in the vertical direction DR3. For example, the upper surface of the first lower semiconductor chip 151 may be formed to be lower than each of the upper surface of the first post 161 and the upper surface of the second post 162.

The second lower semiconductor chip 152 may be disposed on the upper surface of the second redistribution structure 140. The second lower semiconductor chip 152 may be spaced apart from the first lower semiconductor chip 151 in the first horizontal direction DR1. The second lower semiconductor chip 152 may be disposed between the first post 161 and the second post 162. The plurality of second posts 162 may be disposed between the first lower semiconductor chip 151 and the second lower semiconductor chip 152. For example, the second lower semiconductor chip 152 may be spaced apart from each of the first post 161 and the second post 162 in the first horizontal direction DR1. For example, the second lower semiconductor chip 152 may overlap each of the interposer 120 and the connection structure 130 in the vertical direction DR3. For example, the upper surface of the second lower semiconductor chip 152 may be formed to be lower than each of the upper surface of the first post 161 and the upper surface of the second post 162.

The third solder ball 155 may be disposed between the upper surface of the second redistribution structure 140 and the first lower semiconductor chip 151. The first lower semiconductor chip 151 may be connected to the second redistribution structure 140 by using the third solder ball 155. The third solder ball 155 may be disposed between the upper surface of the second redistribution structure 140 and the second lower semiconductor chip 152. The second lower semiconductor chip 152 may be connected to the second redistribution structure 140 by using the third solder ball 155. The third solder ball 155 may include or may be formed of a conductive material. The third solder ball 155 may include or may be formed of at least one of tin (Sn), indium (In), lead (Pb), zinc (Zn), nickel (Ni), gold (Au), silver (Ag), copper (Cu), antimony (Sb), bismuth (Bi), and a combination thereof, but the present disclosure is not limited thereto.

Each of the first lower semiconductor chip 151 and the second lower semiconductor chip 152 may be electrically connected to the second redistribution structure 140 through the third solder ball 155. For example, the first lower semiconductor chip 151 may be electrically connected to the interposer 120 through the third solder ball 155 and the second redistribution structure 140. The first lower semiconductor chip 151 may be electrically connected to the connection structure 130 through the third solder ball 155 and the second redistribution structure 140. The first lower semiconductor chip 151 may be electrically connected to the second post 162 adjacent to the first lower semiconductor chip 151 through the third solder ball 155, the second redistribution structure 140 and the connection structure 130.

For example, the second lower semiconductor chip 152 may be electrically connected to the interposer 120 through the third solder ball 155 and the second redistribution structure 140. The second lower semiconductor chip 152 may be electrically connected to the connection structure 130 through the third solder ball 155 and the second redistribution structure 140. The second lower semiconductor chip 152 may be electrically connected to the second post 162 adjacent to the second lower semiconductor chip 152 through the third solder ball 155, the second redistribution structure 140 and the connection structure 130. In some embodiments, the second post 162 adjacent to the second lower semiconductor chip 152 may be spaced apart from the second post 162 adjacent to the first lower semiconductor chip 151 in the first horizontal direction DR1. In some embodiments, the second post 162 adjacent to the second lower semiconductor chip 152 and the second post 162 adjacent to the first lower semiconductor chip 151 may be disposed between the first lower semiconductor chip 151 and the second lower semiconductor chip 152. An upper end of the second post 162 adjacent to the second lower semiconductor chip 152 and an upper end of the second post 162 adjacent to the first lower semiconductor chip 151 may be electrically connected to different upper semiconductor chips 192 and 191, respectively. For example, the upper end of the second post 162 adjacent to the second lower semiconductor chip 152 may be electrically connected to the second upper semiconductor chip 192, and the upper end of the second post 162 adjacent to the first lower semiconductor chip 151 may be electrically connected to first upper semiconductor chip 191. In some embodiments, a lower end of the second post 162 adjacent to the second lower semiconductor chip 152 may be electrically connected to the first and second lower semiconductor chips 151 and 152 using the second redistribution structure 140 and the connection structure 130, and a lower end of the second post 162 adjacent to the first lower semiconductor chip 151 may be electrically connected to the first and second lower semiconductor chips 151 and 152 using the second redistribution structure 140 and the connection structure 130.

Each of the first lower semiconductor chip 151 and the second lower semiconductor chip 152 may be a logic semiconductor chip. For example, each of the first lower semiconductor chip 151 and the second lower semiconductor chip 152 may be an application processor (AP) such as a Central Processing Unit (CPU), a Graphic Processing Unit (GPU), a Field Programmable Gate Array (FPGA), a digital signal processor, an encryption processor, a microprocessor, a microcontroller, and an Application-Specific IC (ASIC).

For example, each of the first lower semiconductor chip 151 and the second lower semiconductor chip 152 may be a memory semiconductor chip. For example, each of the first lower semiconductor chip 151 and the second lower semiconductor chip 152 may be a volatile memory such as a dynamic random access memory (DRAM) and a static random access memory (SRAM), or may be a non-volatile memory such as a flash memory, a Phase-change Random Access Memory (PRAM), a Magnetoresistive Random Access Memory (MRAM), a Ferroelectric Random Access Memory (FeRAM), and a Resistive Random Access Memory (RRAM).

The second molding layer 170 may be disposed on the upper surface of the second redistribution structure 140. The second molding layer 170 may surround each of the first lower semiconductor chip 151 and the second lower semiconductor chip 152. In some embodiments, the second molding layer 170 may contact upper and lower surfaces, and sidewalls of each of the first and second lower semiconductor chips 151 and 152. The second molding layer 170 may further surround sidewalls of the first post 161 and the second post 162. In some embodiments, the second molding layer 170 may contact the sidewalls of the first and second posts 161 and 162. For example, the second molding layer 170 may cover the upper surface of each of the first lower semiconductor chip 151 and the second lower semiconductor chip 152. For example, each of the first post 161 and the second post 162 may pass through the second molding layer 170 in the vertical direction DR3. The second molding layer 170 may include or may be formed of, for example, a film-type photo imageable encapsulant (PIE), an epoxy molding compound (EMC), or a silicon hybrid material of at least two kinds as a base material.

The third redistribution structure 180 may be disposed on an upper surface of the second molding layer 170. The third redistribution structure 180 may be disposed on each of the upper surface of the first lower semiconductor chip 151 and the upper surface of the second lower semiconductor chip 152. The third redistribution structure 180 may be electrically connected to each of the first post 161 and the second post 162. The third redistribution structure 180 may include a third redistribution pattern 181 and a third insulating layer 182. The third redistribution pattern 181 may be disposed inside the third insulating layer 182. For example, the third redistribution pattern 181 may include a plurality of wires spaced apart from each other in the first horizontal direction DR1 and the second horizontal direction DR2. The third redistribution pattern 181 may include a plurality of wires spaced apart from each other in the vertical direction DR3. For example, a portion of the third redistribution patterns 181 may protrude from an upper surface of the third insulating layer 182, but the present disclosure is not limited thereto.

The first upper semiconductor chip 191 may be disposed on an upper surface of the third redistribution structure 180. For example, the first upper semiconductor chip 191 may overlap each of the first lower semiconductor chip 151, the interposer 120 and the connection structure 130 in the vertical direction DR3. The second upper semiconductor chip 192 may be disposed on the upper surface of the third redistribution structure 180. For example, the second upper semiconductor chip 192 may be spaced apart from the first upper semiconductor chip 191 in the first horizontal direction DR1. For example, the second upper semiconductor chip 192 may overlap each of the second lower semiconductor chip 152, the interposer 120 and the connection structure 130 in the vertical direction DR3.

The fourth solder ball 195 may be disposed between the upper surface of the third redistribution structure 180 and the first upper semiconductor chip 191. The first upper semiconductor chip 191 may be connected to the third redistribution structure 180 by using the fourth solder ball 195. The fourth solder ball 195 may be disposed between the upper surface of the third redistribution structure 180 and the second upper semiconductor chip 192. The second upper semiconductor chip 192 may be connected to the third redistribution structure 180 by using the fourth solder ball 195. The fourth solder ball 195 may include or may be formed of a conductive material. The fourth solder ball 195 may include or may be formed of at least one of, for example, tin (Sn), indium (In), lead (Pb), zinc (Zn), nickel (Ni), gold (Au), silver (Ag), copper (Cu), antimony (Sb), bismuth (Bi), and a combination thereof, but the present disclosure is not limited thereto.

Each of the first upper semiconductor chip 191 and the second upper semiconductor chip 192 may be electrically connected to the third redistribution structure 180 through the fourth solder ball 195. For example, the first upper semiconductor chip 191 may be electrically connected to the interposer 120 through the fourth solder ball 195, the third redistribution structure 180, the first post 161 adjacent to the first lower semiconductor chip 151 and the second redistribution structure 140. The first upper semiconductor chip 191 may be electrically connected to the first lower semiconductor chip 151 through the fourth solder ball 195, the third redistribution structure 180, the second post 162 adjacent to the first lower semiconductor chip 151, the second redistribution structure 140 and the connection structure 130.

For example, the second upper semiconductor chip 192 may be electrically connected to the interposer 120 through the fourth solder ball 195, the third redistribution structure 180, the first post 161 adjacent to the second lower semiconductor chip 152, and the second redistribution structure 140. The second upper semiconductor chip 192 may be electrically connected to the second lower semiconductor chip 152 through the fourth solder ball 195, the third redistribution structure 180, the second post 162 adjacent to the second lower semiconductor chip 152, the second redistribution structure 140 and the connection structure 130. For example, the second post 162 adjacent to the second upper semiconductor chip 192 may be spaced apart from the second post 162 adjacent to the first upper semiconductor chip 191 in the first horizontal direction DR1. In some embodiments, the second post 162 adjacent to the second lower semiconductor chip 152 and the second post 162 adjacent to the first lower semiconductor chip 151 may be disposed between the first lower semiconductor chip 151 and the second lower semiconductor chip 152. An upper end of the second post 162 adjacent to the second lower semiconductor chip 152 and an upper end of the second post 162 adjacent to the first lower semiconductor chip 151 may be electrically connected to different upper semiconductor chips 192 and 191, respectively. For example, the upper end of the second post 162 adjacent to the second lower semiconductor chip 152 may be electrically connected to the second upper semiconductor chip 192, and the upper end of the second post 162 adjacent to the first lower semiconductor chip 151 may be electrically connected to first upper semiconductor chip 191. In some embodiments, a lower end of the second post 162 adjacent to the second lower semiconductor chip 152 may be electrically connected to the first and second lower semiconductor chips 151 and 152 using the second redistribution structure 140 and the connection structure 130, and a lower end of the second post 162 adjacent to the first lower semiconductor chip 151 may be electrically connected to the first and second lower semiconductor chips 151 and 152 using the second redistribution structure 140 and the connection structure 130.

Each of the first upper semiconductor chip 191 and the second upper semiconductor chip 192 may be a logic semiconductor chip. For example, each of the first upper semiconductor chip 191 and the second upper semiconductor chip 192 may be an application processor (AP) such as a Central Processing Unit (CPU), a Graphic Processing Unit (GPU), a Field Programmable Gate Array (FPGA), a digital signal processor, an encryption processor, a microprocessor, a microcontroller, and an Application-Specific IC (ASIC).

For example, each of the first upper semiconductor chip 191 and the second upper semiconductor chip 192 may be a memory semiconductor chip. For example, each of the first upper semiconductor chip 191 and the second upper semiconductor chip 192 may be a volatile memory such as a dynamic random access memory (DRAM) and a static random access memory (SRAM), or may be a non-volatile memory such as a flash memory, a Phase-change Random Access Memory (PRAM), a Magnetoresistive Random Access Memory (MRAM), a Ferroelectric Random Access Memory (FeRAM), and a Resistive Random Access Memory (RRAM).

In the semiconductor package according to some embodiments of the present disclosure, the connection structure 130 may be disposed inside the interposer 120, the plurality of lower semiconductor chips 151 and 152 may be disposed on the interposer 120 and the connection structure 130, the plurality of upper semiconductor chips 191 and 192 may be disposed on the plurality of lower semiconductor chips 151 and 152, and the plurality of lower semiconductor chips 151 and 152 may be electrically connected to the plurality of upper semiconductor chips 191 and 192 by using the connection structure 130. Therefore, the semiconductor package according to some embodiments of the present disclosure may improve reliability in the connection relation between the upper and lower semiconductor chips 151, 152, 191 and 192 that are vertically stacked. For example, using the connection structure disposed inside the recess R1, each of the upper semiconductor chips 191 and 192 may be electrically connected to the lower semiconductor chips 151 and 152 without increasing the height of the package. Since the connection structure 130 and the second posts 162 are disposed in a region between the lower semiconductor chips 151 and 152, electrical paths between the first upper semiconductor chip 191 and each of the lower semiconductor chips 151 and 152 and between the second upper semiconductor chip 192 and each of the lower semiconductor chips 151 and 152 may be shortened and symmetric relative to an imaginary vertical line extending at the midway between the lower semiconductor chips 151 and 152. Since the connection structure 130 partially overlaps the lower semiconductor chips 151 and 152 in the vertical direction DR3, a planar area of the package may be reduced.

Hereinafter, a method of manufacturing a semiconductor package according to some embodiments of the present disclosure will be described with reference to FIGS. 2 to 12.

FIGS. 3 to 12 are views illustrating intermediate steps to describe a method of manufacturing a semiconductor package according to some embodiments of the present disclosure.

Figure 3:
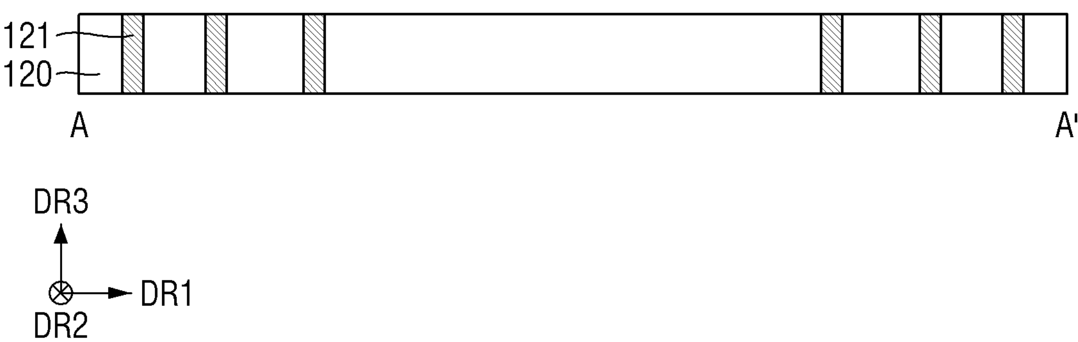
FIGS. 3 to 12 are views illustrating intermediate steps to describe a method of manufacturing a semiconductor package according to some embodiments of the present disclosure.

Referring to FIG. 3, the interposer 120 in which a plurality of through vias 121 are formed at an edge portion may be provided. For example, the plurality of through vias 121 may pass through the interposer 120 in the vertical direction DR3.

Figure 4:
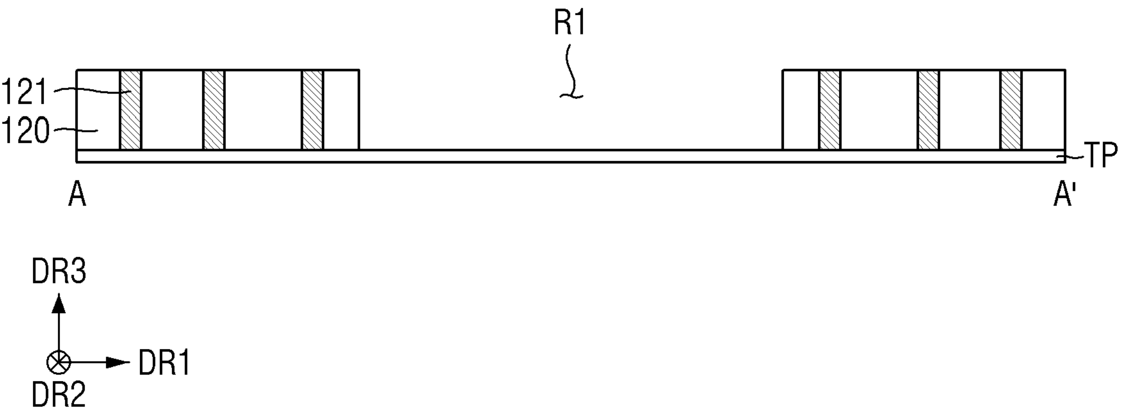

Referring to FIG. 4, the recess R1 may be formed inside the interposer 120. In some embodiments, the recess R1 may extend from an upper surface of the interposer 120 to a lower surface of the interposer 120. In some embodiment, the recess R1 may correspond to an opening of the interposer 120 that can accommodate the connection structure 130. For example, the recess R1 may be formed at a central portion of the interposer 120. For example, the recess R1 may be formed between the plurality of through vias 121. Subsequently, a tape TP may be attached to the lower surface of the interposer 120. The tape TP may form a bottom surface of the recess R1.

Figure 5:
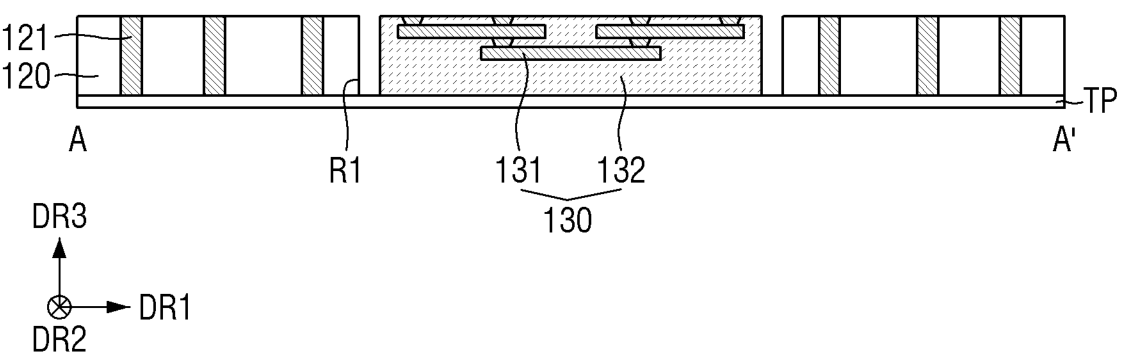

Referring to FIG. 5, the connection structure 130 may be formed inside the recess R1. For example, the connection structure 130 may be attached to a portion of the tape TP that is exposed by the recess R1. For example, the connection structure 130 may be disposed inside the recess R1, and a sidewall of the connection structure 130 may be spaced apart from an inner sidewall of the interposer 120 in the first horizontal direction DR1. The inner sidewall of the interposer 120 may be defined by the recess R1. For example, the upper surface of the connection structure 130 may be formed on the same plane as the upper surface of the interposer 120. For example, the lower surface of the connection structure 130 may be formed on the same plane as the lower surface of the interposer 120. The connection structure 130 may include a base material layer 132 and a connection wiring pattern 131 disposed inside the base material layer 132.

Figure 6:
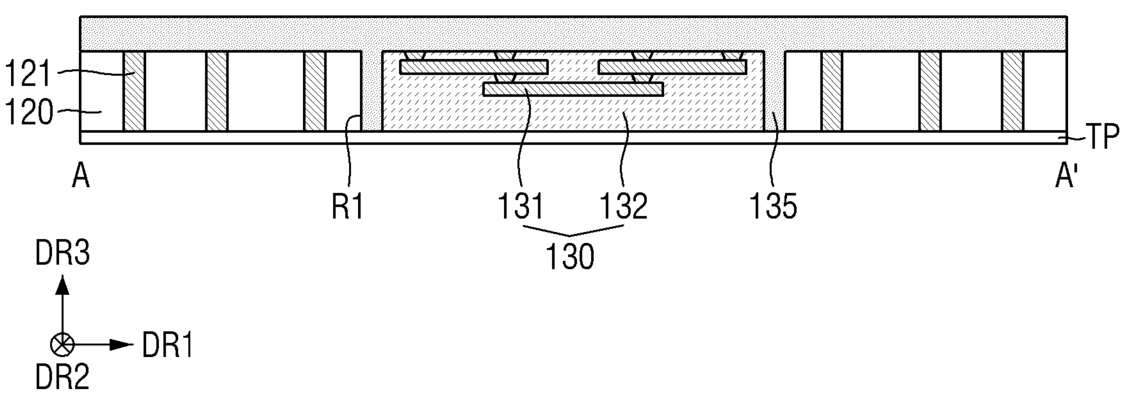

Referring to FIG. 6, the first molding layer 135 may be formed on the tape TP to cover the interposer 120 and the connection structure 130. For example, the first molding layer 135 may be disposed inside the recess R1, and may fill a space between the interposer 120 and the connection structure 130. For example, the first molding layer 135 may cover the upper surface of the interposer 120 and the upper surface of the connection structure 130.

Figure 7:
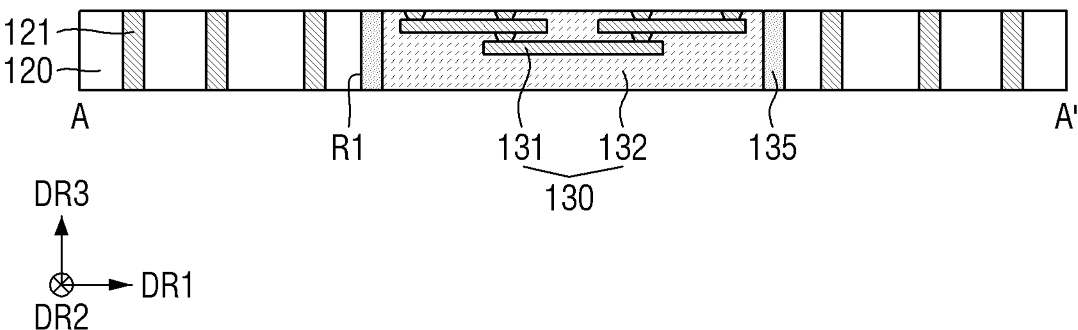

Referring to FIG. 7, a portion of the first molding layer 135 may be removed so that each of the upper surface of the interposer 120 and the upper surface of the connection structure 130 is exposed. Then, the tape TP may be removed.

Figure 8:
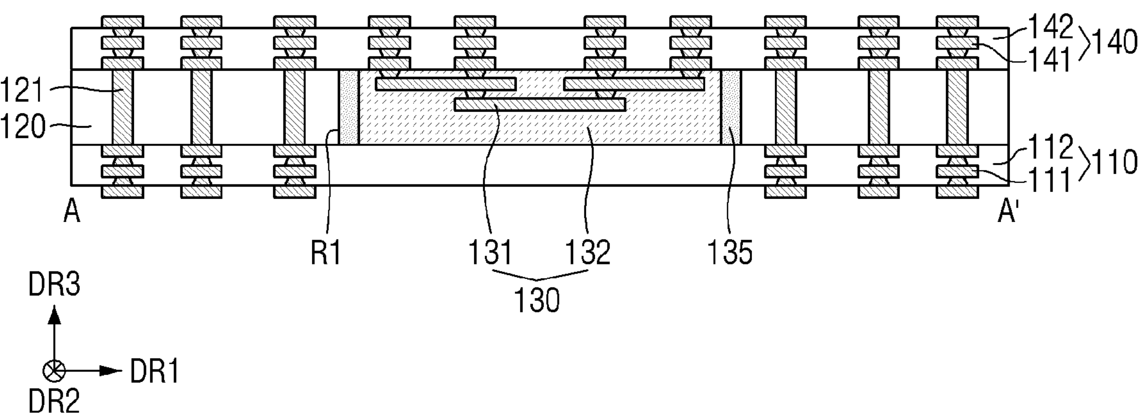

Referring to FIG. 8, the first redistribution structure 110 may be formed on the lower surface of the interposer 120. The second redistribution structure 140 may be formed on the upper surface of the interposer 120. In some embodiments, the second redistribution structure 140 may be formed after the first redistribution structure 110 is formed. In some embodiments, the first redistribution structure 110 may be formed after the second redistribution structure 140 is formed.

Figure 9:
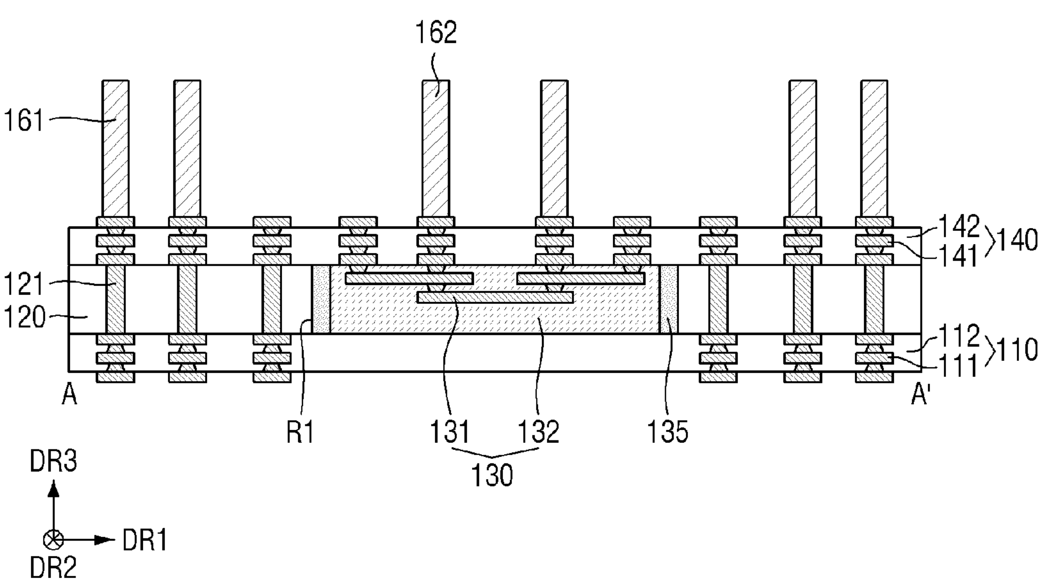

Referring to FIG. 9, the plurality of first posts 161 and the plurality of second posts 162 may be formed on the upper surface of the second redistribution structure 140. Each of the plurality of first posts 161 and the plurality of second posts 162 may be connected to the second redistribution pattern 141 of the second redistribution structure 140. Each of the plurality of first posts 161 and the plurality of second posts 162 may extend in the vertical direction DR3.

For example, the plurality of first posts 161 may be formed on the edge portion of the second redistribution structure 140. The plurality of first posts 161 may overlap the interposer 120 in the vertical direction DR3. For example, the plurality of second posts 162 may be formed on the central portion of the second redistribution structure 140. The plurality of second posts 162 may overlap the connection structure 130 in the vertical direction DR3.

Figure 10:
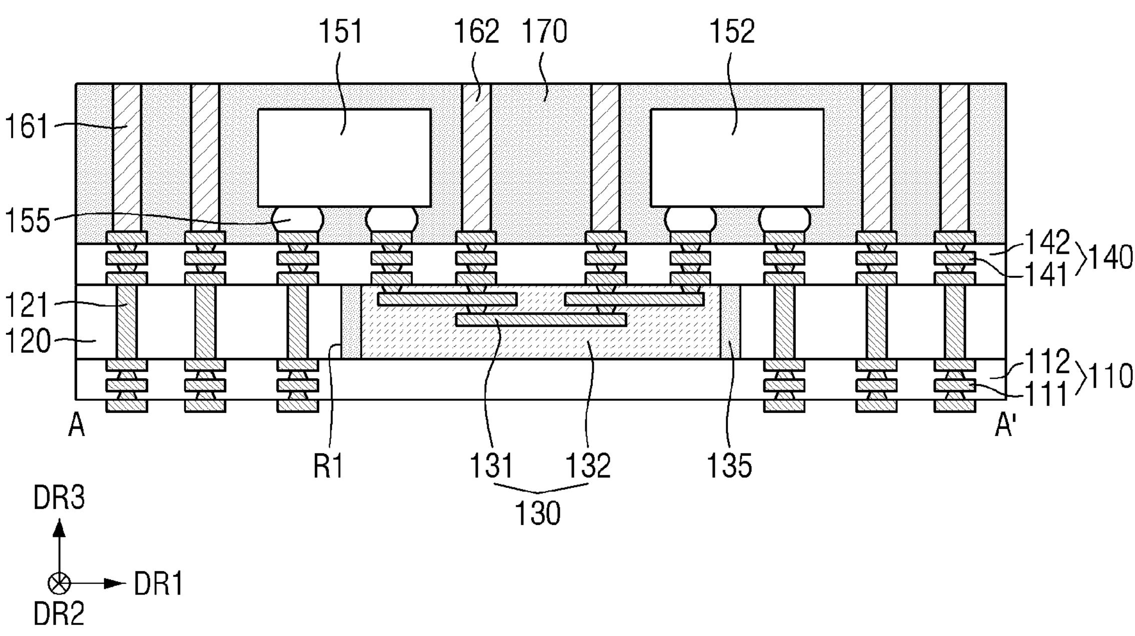

Referring to FIG. 10, the second molding layer 170 may be formed on the upper surface of the second redistribution structure 140. The second molding layer 170 may surround each of the first lower semiconductor chip 151 and the second lower semiconductor chip 152. In some embodiments, the second molding layer 170 may contact upper and lower surfaces, and sidewalls of each of the first and second lower semiconductor chips 151 and 152. The second molding layer 170 may further surround sidewalls of the first post 161 and the second post 162. For example, the second molding layer 170 may cover the upper surface of each of the first lower semiconductor chip 151 and the second lower semiconductor chip 152. For example, each of the plurality of first posts 161 and the plurality of second posts 162 may be exposed at the upper surface of the second molding layer 170.

Figure 11:
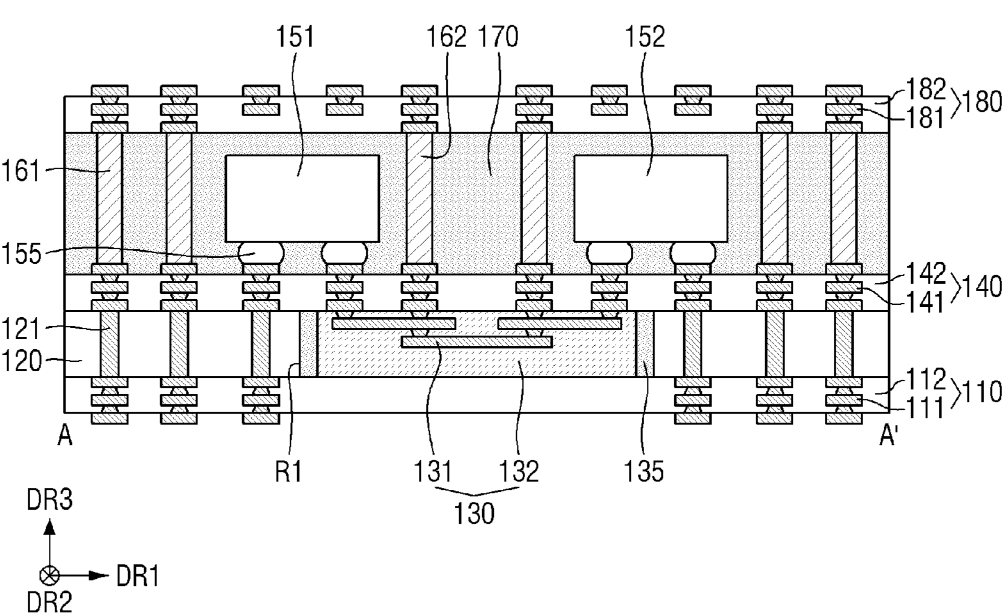

Referring to FIG. 11, the third redistribution structure 180 may be formed on the second molding layer 170, the plurality of first posts 161 and the plurality of second posts 162. Each of the plurality of first posts 161 and the plurality of second posts 162 may be connected to the third redistribution pattern 181 of the third redistribution structure 180.

Figure 12:
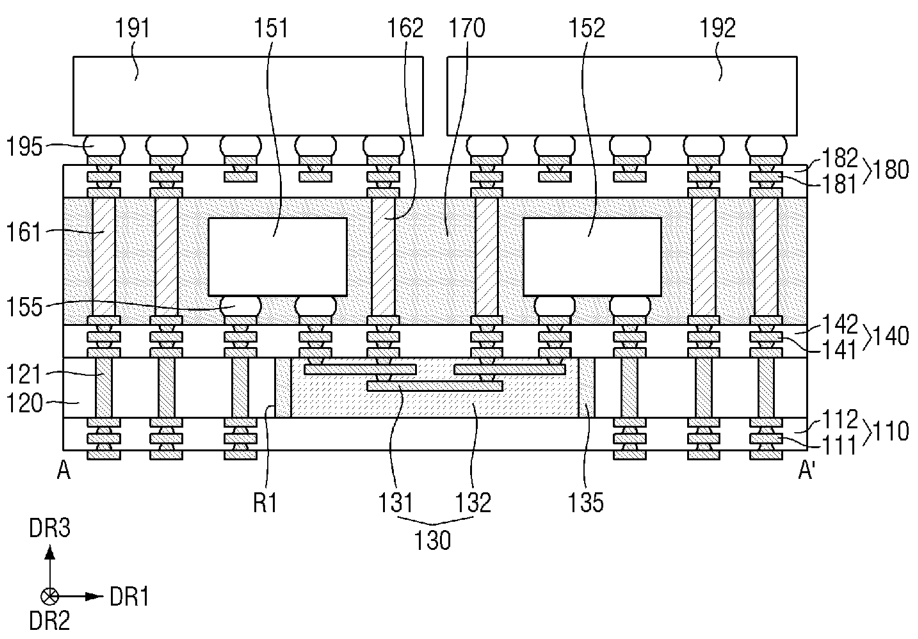

Referring to FIG. 12, the first upper semiconductor chip 191 and the second upper semiconductor chip 192 may be formed on the upper surface of the third redistribution structure 180. Each of the first upper semiconductor chip 191 and the second upper semiconductor chip 192 may be connected to the third redistribution pattern 181 of the third redistribution structure 180 by using the fourth solder ball 195.

The second upper semiconductor chip 192 may be spaced apart from the first upper semiconductor chip 191 in the first horizontal direction DR1. For example, the first upper semiconductor chip 191 may overlap each of the first lower semiconductor chip 151, the interposer 120 and the connection structure 130 in the vertical direction DR3. For example, the second upper semiconductor chip 192 may overlap each of the second lower semiconductor chip 152, the interposer 120 and the connection structure 130 in the vertical direction DR3.

Referring to FIG. 2, the substrate 100 having a conductive pad 101 and a first solder ball 105, which are formed on the lower surface thereof, may be provided. The lower surface of the first redistribution structure 110 may be attached to the upper surface of the substrate 100 by using the second solder ball 115. Through this manufacturing process, the semiconductor package as shown in FIG. 2 may be manufactured.

Hereinafter, a semiconductor package according to some embodiments of the present disclosure will be described with reference to FIG. 13. The following description will be made on differences from the semiconductor packages as shown in FIGS. 1 and 2.

Figure 13:
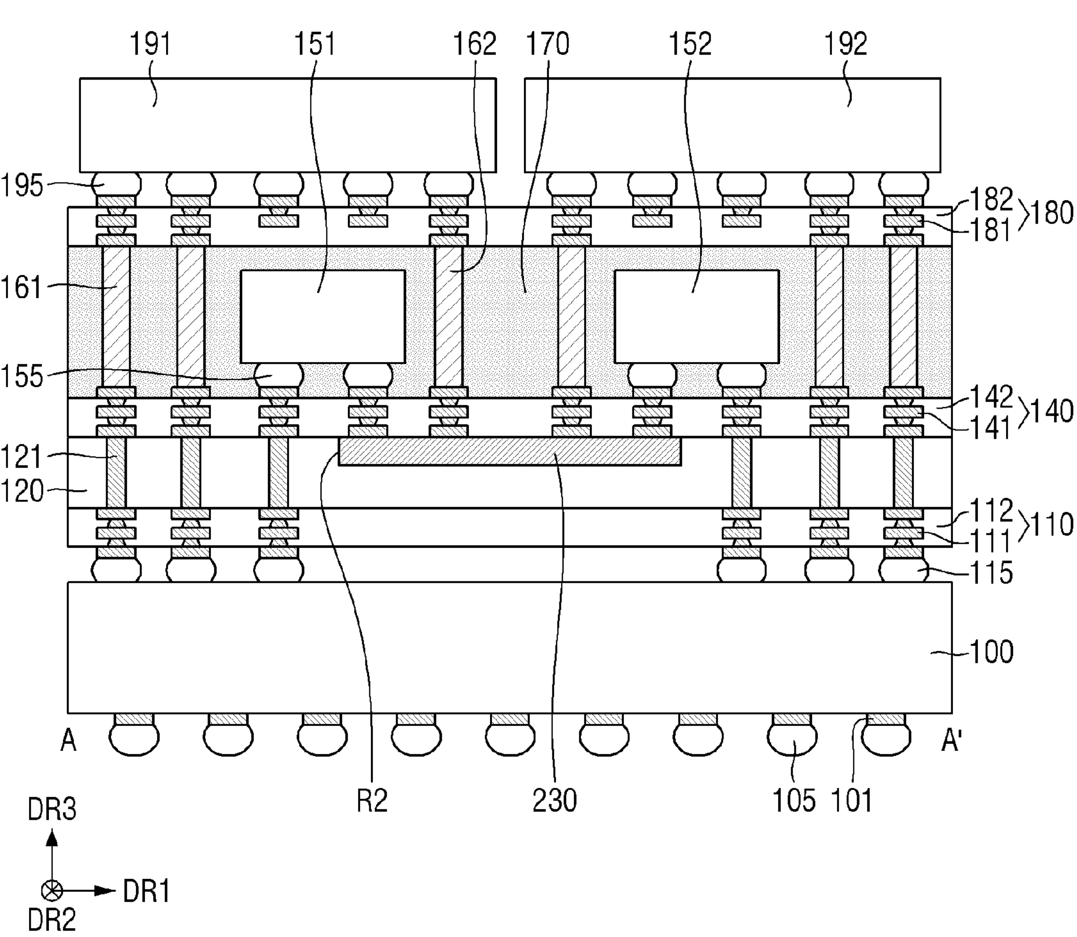
FIG. 13 is a cross-sectional view illustrating a semiconductor package according to some embodiments of the present disclosure.

FIG. 13 is a cross-sectional view illustrating a semiconductor package according to some embodiments of the present disclosure.

Referring to FIG. 13, in the semiconductor package according to some embodiments of the present disclosure, the connection structure 230 may include or may be formed of a conductive material.

For example, the recess R2 may be disposed inside the interposer 120. A sidewall and a bottom surface of the recess R2 may be defined by the interposer 120. The bottom surface of the recess R2 may be formed between the lower surface of the interposer 120 and the upper surface of the interposer 120. The connection structure 230 may be disposed inside the recess R2. Each of a sidewall and a bottom surface of the connection structure 230 may be in contact with a recessed upper surface of the interposer 120. The recessed upper surface of the interposer 120 may be defined by the recess R2. For example, the upper surface of the connection structure 230 may be formed on the same plane as the upper surface of the interposer 120. For example, the lower surface of the connection structure 230 may be formed between the lower surface of the interposer 120 and the upper surface of the interposer 120.

The connection structure 230 may include or may be formed of a conductive material. The connection structure 230 may include or may be formed of at least one of, for example, copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), aluminum (Al), and zirconium (Zr).

Hereinafter, a semiconductor package according to some embodiments of the present disclosure will be described below with reference to FIG. 14. The following description will be made on differences from the semiconductor packages as shown in FIGS. 1 and 2.

Figure 14:
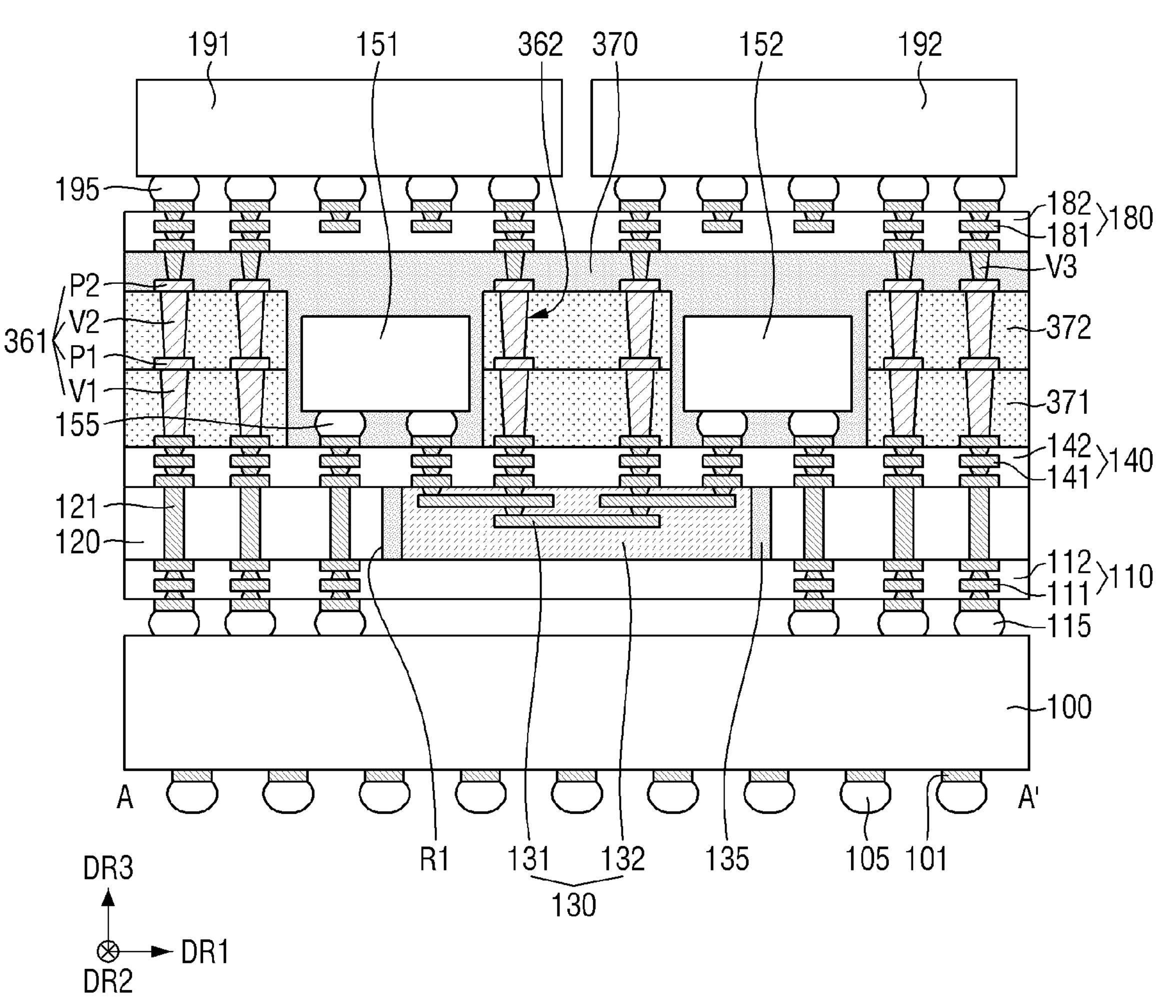
FIG. 14 is a cross-sectional view illustrating a semiconductor package according to some embodiments of the present disclosure.

FIG. 14 is a cross-sectional view illustrating a semiconductor package according to some embodiments of the present disclosure.

Referring to FIG. 14, the semiconductor package according to some embodiments of the present disclosure may have a fan-out panel level package structure. For example, the semiconductor package according to some embodiments of the present disclosure may include a first post 361, a second post 362, a first stack insulating layer 371, a second stack insulating layer 372 and a third via V3.

For example, the first stack insulating layer 371 may be disposed on the upper surface of the second redistribution structure 140. The first stack insulating layer 371 may surround a sidewall of each of the first lower semiconductor chip 151 and the second lower semiconductor chip 152. The first stack insulating layer 371 may be spaced apart from the sidewall of each of the first lower semiconductor chip 151 and the second lower semiconductor chip 152 in the first horizontal direction DR1.

The second stack insulating layer 372 may be disposed on the upper surface of the first stack insulating layer 371. The second stack insulating layer 372 may surround the sidewall of each of the first lower semiconductor chip 151 and the second lower semiconductor chip 152. The second stack insulating layer 372 may be spaced apart from the sidewall of each of the first lower semiconductor chip 151 and the second lower semiconductor chip 152 in the first horizontal direction DR1. In some embodiments, the second molding layer 370 may fill a space between each of the first and second stack insulating layers 371 and 372 and the sidewall of each of the first and second lower semiconductor chips 151 and 152.

For example, a sidewall of the second stack insulating layer 372 may be aligned with that of the first stack insulating layer 371 in the vertical direction DR3. For example, an upper surface of the second stack insulating layer 372 may be formed to be higher than the upper surface of each of the first lower semiconductor chip 151 and the second lower semiconductor chip 152. Each of the first stack insulating layer 371 and the second stack insulating layer 372 may include or may be formed of at least one of, for example, an epoxy resin, polyimide, prepreg (PPG), an Ajinomoto Build-up Film (ABF), FR4 (or FR-4), and Bismaleimide Triazine (BT), but the present disclosure is not limited thereto.

The plurality of first posts 361 and the plurality of second posts 362 may respectively pass through the first stack insulating layer 371 and the second stack insulating layer 372 in the vertical direction DR3. For example, at least a portion of the first post 361 and at least a portion of the second post 362 may be exposed on the upper surface of the second stack insulating layer 372.

For example, the first post 361 may include a first via V1, a first pad P1, a second via V2 and a second pad P2. For example, the first via V1 may be disposed inside the first stack insulating layer 371. The first via V1 may extend in the vertical direction DR3. The first via V1 may be connected to the second redistribution pattern 141. An upper surface of the first via V1 may be formed on the same plane as the upper surface of the first stack insulating layer 371. For example, the first pad P1 may be disposed inside the second stack insulating layer 372. The first pad P1 may be disposed on the upper surface of the first stack insulating layer 371. The first pad P1 may be connected to the first via V1.

For example, the second via V2 may be disposed inside the second stack insulating layer 372. The second via V2 may extend in the vertical direction DR3. The second via V2 may be connected to the first pad P1. An upper surface of the second via V2 may be formed on the same plane as the upper surface of the second stack insulating layer 372. The second pad P2 may be disposed on the upper surface of the second stack insulating layer 372. The second pad P2 may be connected to the second via V2. For example, each of the first via V1, the first pad P1, the second via V2 and the second pad P2 may include or may be formed of a conductive material. The second post 362 may have the same structure as that of the first post 361.

The second molding layer 370 may be disposed on the upper surface of the second redistribution structure 140. The second molding layer 370 may surround sidewalls of the first lower semiconductor chip 151 and the second lower semiconductor chip 152, and may cover a sidewall of the first stack insulating layer 371, and a sidewall and an upper surface of the second stack insulating layer 372. The upper surface of the second molding layer 370 may be formed to be higher than the upper surface of the second stack insulating layer 372. The third via V3 may be connected to each of the plurality of first posts 361 and the plurality of second posts 362 by passing through the second molding layer 370 in the vertical direction DR3. The third via V3 may include or may be formed of a conductive material.

The third redistribution structure 180 may be disposed on the upper surface of the second molding layer 370 and the upper surface of the third via V3. The third redistribution structure 180 may be connected to each of the plurality of first posts 361 and the plurality of second posts 362 through the third via V3.

Hereinafter, a semiconductor package according to some embodiments of the present disclosure will be described below with reference to FIGS. 15 and 16. The following description will be made on differences from the semiconductor packages as shown in FIGS. 1 and 2.

Figure 15:
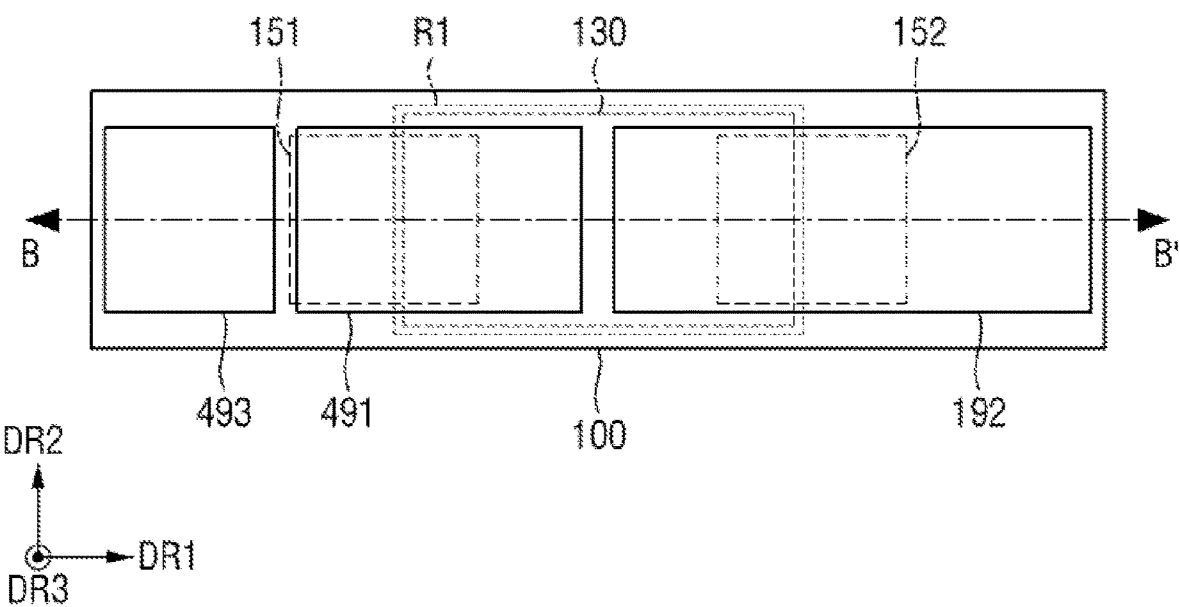
FIG. 15 is a schematic plan view illustrating a semiconductor package according to some embodiments of the present disclosure.

FIG. 15 is a schematic plan view illustrating a semiconductor package according to some embodiments of the present disclosure. FIG. 16 is a cross-sectional view taken along line B-B' of FIG. 15.

Figure 16:
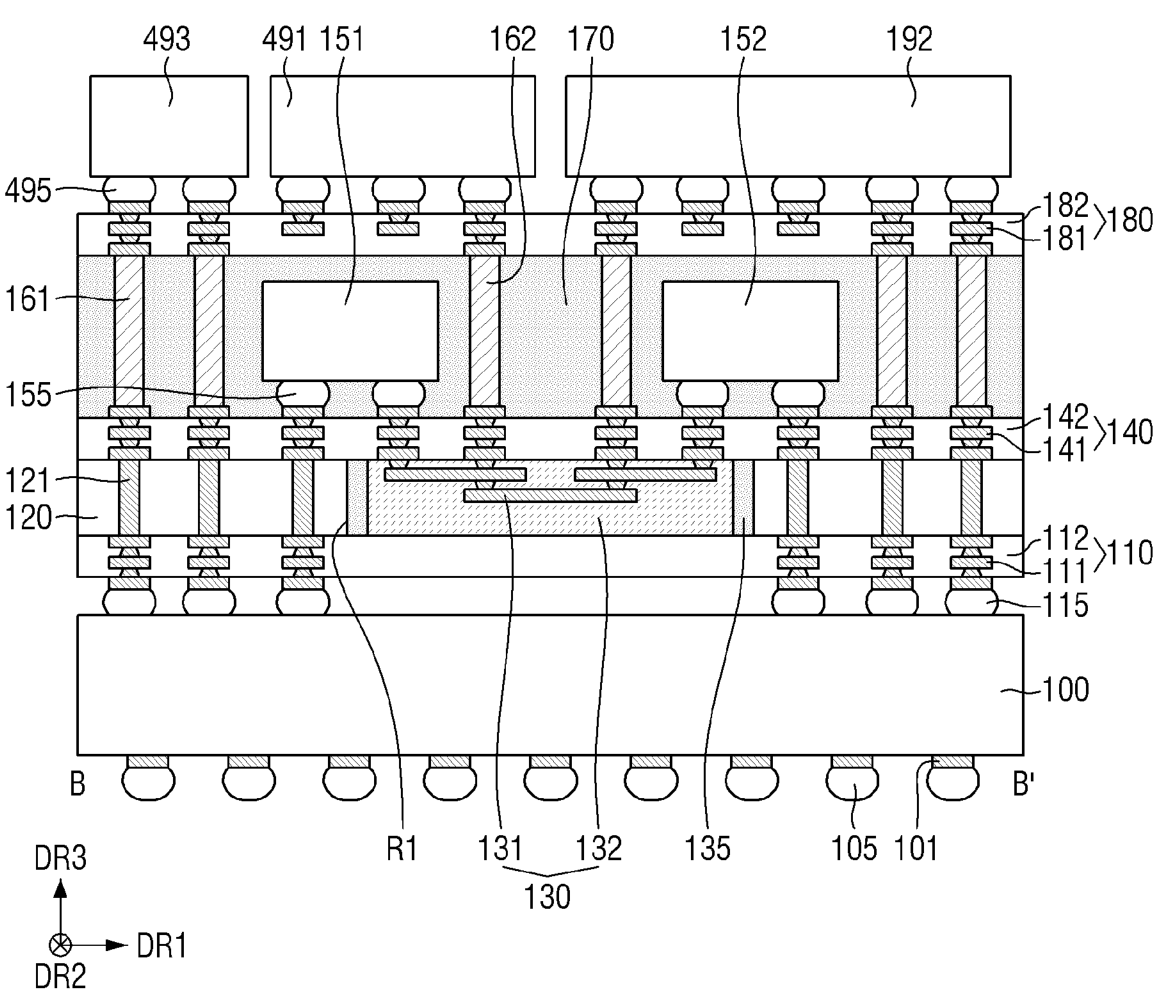
FIG. 16 is a cross-sectional view taken along line B-B' of FIG. 15.

Referring to FIGS. 15 and 16, the semiconductor package according to some embodiments of the present disclosure may include a first upper semiconductor chip 491, a second upper semiconductor chip 192 and a third upper semiconductor chip 493.

For example, each of the first upper semiconductor chip 491, the second upper semiconductor chip 192 and the third upper semiconductor chip 493 may be disposed on the upper surface of the third redistribution structure 180. Each of the first upper semiconductor chip 491, the second upper semiconductor chip 192 and the third upper semiconductor chip 493 may be connected to the upper surface of the third redistribution structure 180 by using a fourth solder ball 495.

The third upper semiconductor chip 493 may overlap the interposer 120 in the vertical direction DR3. The third upper semiconductor chip 493 may be electrically connected to the first post 161 through the third redistribution structure 180. The third upper semiconductor chip 493 may overlap the interposer 120 in the vertical direction DR3. The first upper semiconductor chip 491 may be spaced apart from the third upper semiconductor chip 493 in the first horizontal direction DR1. The first upper semiconductor chip 491 may be electrically connected to the second post 162 through the third redistribution structure 180. The first upper semiconductor chip 491 may overlap each of the interposer 120 and the connection structure 130 in the vertical direction DR3.

The second upper semiconductor chip 192 may be spaced apart from the first upper semiconductor chip 491 in the first horizontal direction DR1. The second upper semiconductor chip 192 may be electrically connected to each of the first post 161 and the second post 162 through the third redistribution structure 180. The second upper semiconductor chip 192 may overlap each of the interposer 120 and the connection structure 130 in the vertical direction DR3. Each of the first upper semiconductor chip 491, the second upper semiconductor chip 192 and the third upper semiconductor chip 493 may be, for example, a logic semiconductor chip or a memory semiconductor chip.

Hereinafter, a semiconductor package according to some embodiments of the present disclosure will be described with reference to FIGS. 17 and 18. The following description will be made on differences from the semiconductor packages as shown in FIGS. 1 and 2.

Figure 17:
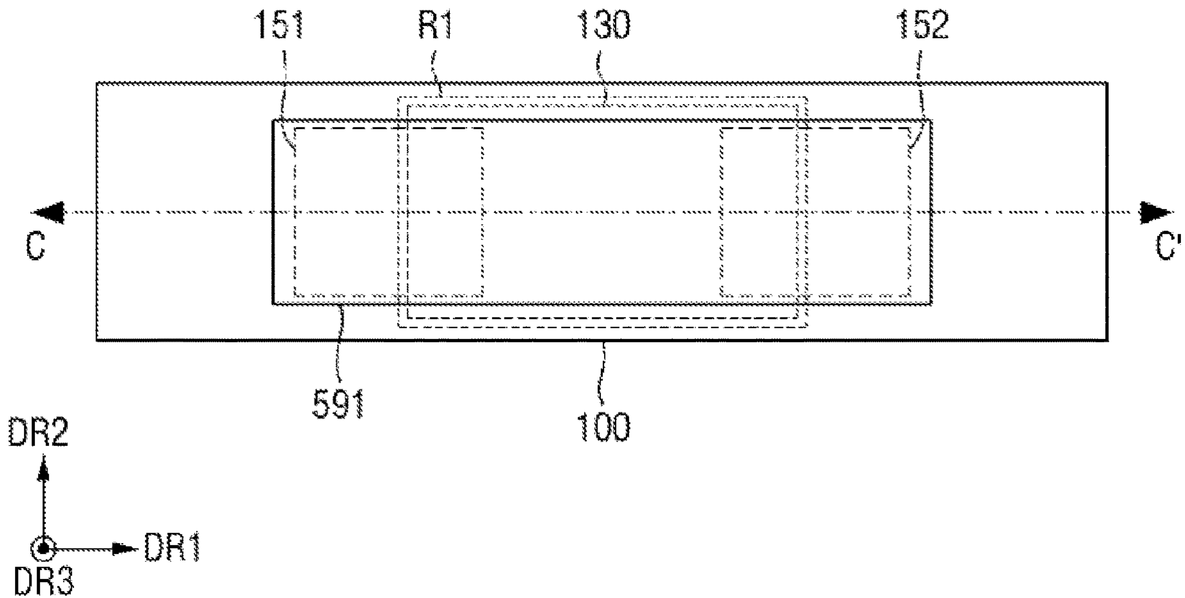
FIG. 17 is a schematic plan view illustrating a semiconductor package according to some embodiments of the present disclosure.

FIG. 17 is a schematic plan view illustrating a semiconductor package according to some embodiments of the present disclosure. FIG. 18 is a cross-sectional view taken along line C-C' of FIG. 17.

Figure 18:
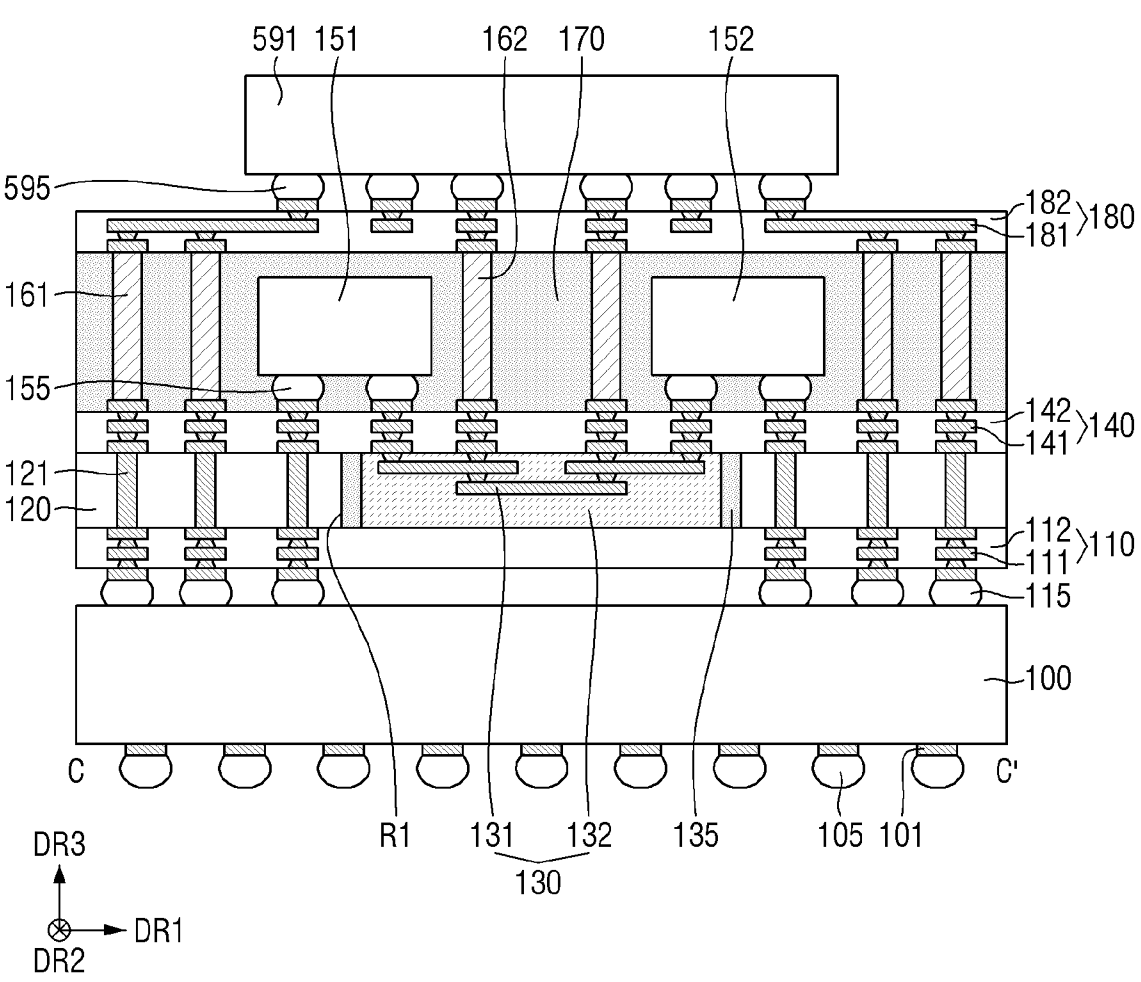
FIG. 18 is a cross-sectional view taken along line C-C' of FIG. 17.

Referring to FIGS. 17 and 18, in the semiconductor package according to some embodiments of the present disclosure, a first upper semiconductor chip 591 may be disposed on the first lower semiconductor chip 151 and the second lower semiconductor chip 152.

For example, the first upper semiconductor chip 591 may be disposed on the upper surface of the third redistribution structure 180. The first upper semiconductor chip 591 may overlap each of the first lower semiconductor chip 151 and the second lower semiconductor chip 152 in the vertical direction DR3. The first upper semiconductor chip 591 may overlap the connection structure 130 in the vertical direction DR3. The first upper semiconductor chip 591 may be connected to the upper surface of the third redistribution structure 180 by using a fourth solder ball 595.

For example, the first upper semiconductor chip 591 may be electrically connected to the interposer 120 through the fourth solder ball 595, the third redistribution structure 180, the first post 161 and the second redistribution structure 140. The first upper semiconductor chip 591 may be electrically connected to each of the first lower semiconductor chip 151 and the second lower semiconductor chip 152 through the fourth solder ball 595, the third redistribution structure 180, the second post 162, the second redistribution structure 140 and the connection structure 130.

Hereinafter, a semiconductor package according to some embodiments of the present disclosure will be described with reference to FIGS. 19 and 20. The following description will be made on differences from the semiconductor packages as shown in FIGS. 1 and 2.

Figure 19:
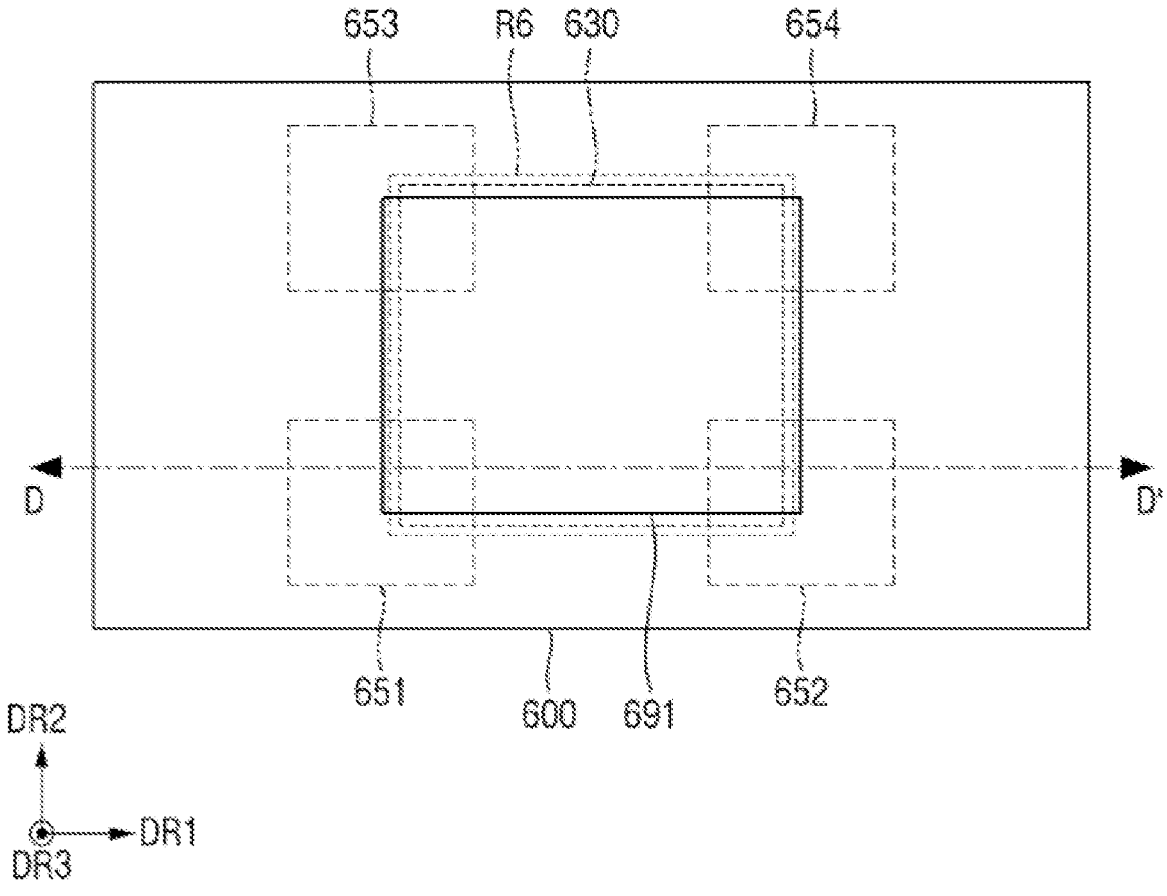
FIG. 19 is a schematic plan view illustrating a semiconductor package according to some embodiments of the present disclosure.

FIG. 19 is a schematic plan view illustrating a semiconductor package according to some embodiments of the present disclosure. FIG. 20 is a cross-sectional view taken along line C-C' of FIG. 19.

Figure 20:
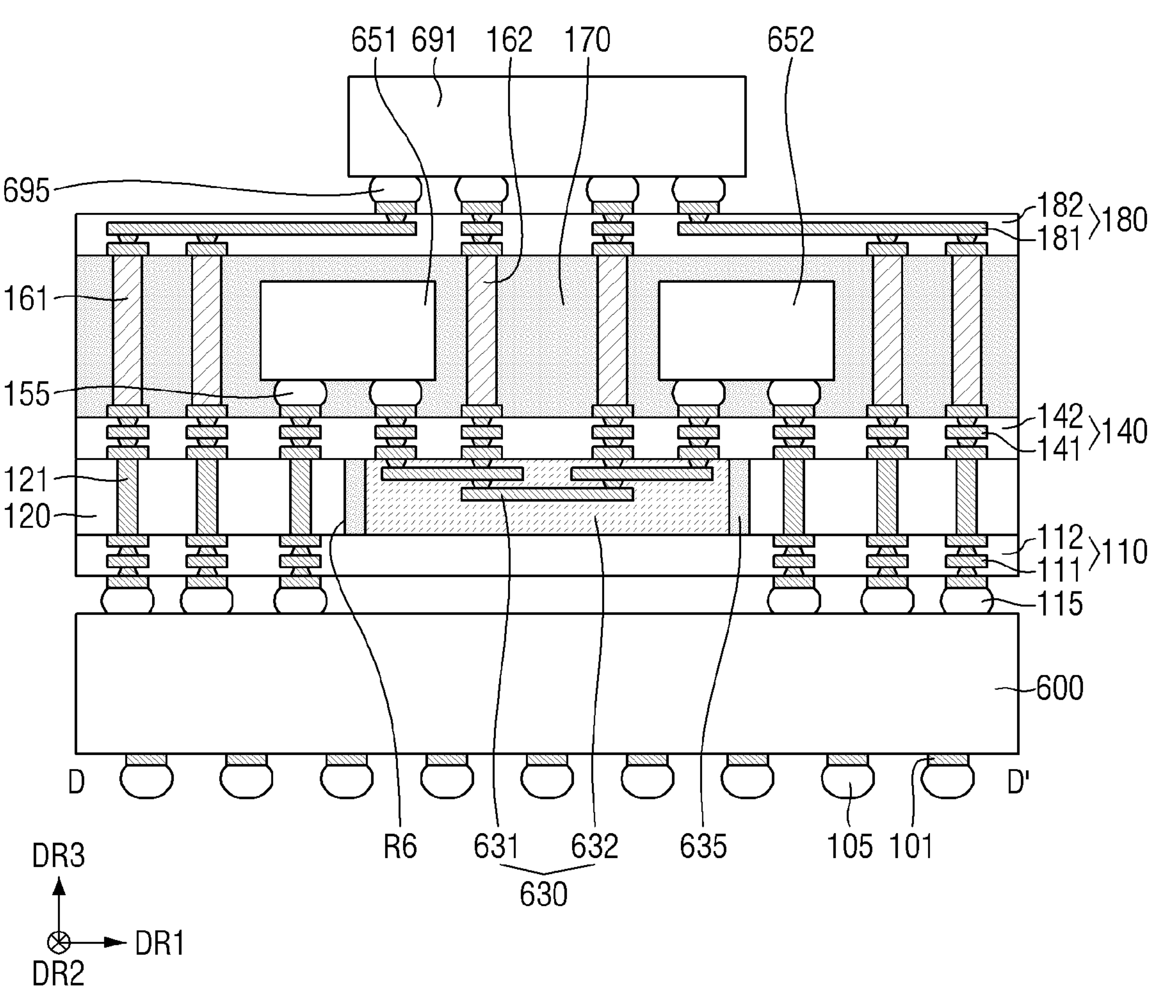
FIG. 20 is a cross-sectional view taken along line C-C' of FIG. 19.

Referring to FIGS. 19 and 20, in the semiconductor package according to some embodiments of the present disclosure, four lower semiconductor chips 651, 652, 653 and 654 may be disposed on a substrate 600, and one upper semiconductor chip 691 may be disposed on the four lower semiconductor chips 651, 652, 653 and 654.

For example, each of the first to fourth lower semiconductor chips 651, 652, 653 and 654 may be disposed on the upper surface of the second redistribution structure 140. The second lower semiconductor chip 652 may be spaced apart from the first lower semiconductor chip 651 in the first horizontal direction DR1. The third lower semiconductor chip 653 may be spaced apart from the first lower semiconductor chip 651 in the second horizontal direction DR2. The fourth lower semiconductor chip 654 may be spaced apart from the third lower semiconductor chip 653 in the first horizontal direction DR1. The fourth lower semiconductor chip 654 may be spaced apart from the second lower semiconductor chip 652 in the second horizontal direction DR2.

A connection structure 630 may be disposed inside a recess R6 formed inside the interposer 120. A first molding layer 635 may be disposed inside the recess R6, and may be disposed between the connection structure 630 and the interposer 120. The connection structure 630 may include a base material layer 632 and a connection wiring pattern 631 disposed inside the base material layer 632.

Each of the first to fourth lower semiconductor chips 651, 652, 653 and 654 may overlap the connection structure 630 in the vertical direction DR3. Each of the first to fourth lower semiconductor chips 651, 652, 653 and 654 may be electrically connected to the connection structure 630 through the second redistribution structure 140.

For example, the first upper semiconductor chip 691 may be disposed on the upper surface of the third redistribution structure 180. The first upper semiconductor chip 691 may overlap each of the first to fourth lower semiconductor chips 651, 652, 653 and 654 in the vertical direction DR3. The first upper semiconductor chip 691 may overlap the connection structure 630 in the vertical direction DR3. The first upper semiconductor chip 691 may be connected to the upper surface of the third redistribution structure 180 by using a fourth solder ball 695.

For example, the first upper semiconductor chip 691 may be electrically connected to the interposer 120 through the fourth solder ball 695, the third redistribution structure 180, the first post 161 and the second redistribution structure 140. The first upper semiconductor chip 691 may be electrically connected to each of the first to fourth lower semiconductor chips 651, 652, 653 and 654 through the fourth solder ball 695, the third redistribution structure 180, the second post 162, the second redistribution structure 140 and the connection structure 630.

Hereinafter, a semiconductor package according to some embodiments of the present disclosure will be described with reference to FIGS. 21 to 23. The following description will be made on differences from the semiconductor packages as shown in FIGS. 1 and 2.

Figure 21:
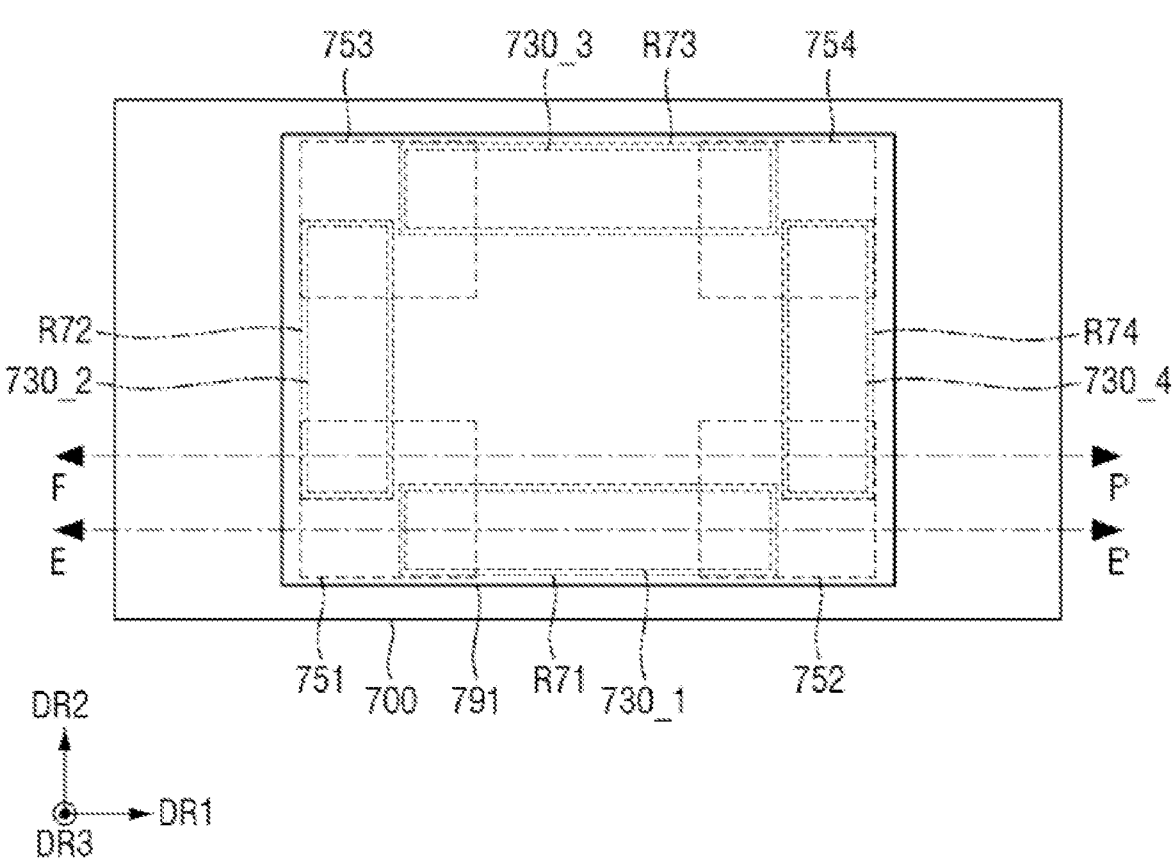
FIG. 21 is a schematic plan view illustrating a semiconductor package according to some embodiments of the present disclosure.

FIG. 21 is a schematic plan view illustrating a semiconductor package according to some embodiments of the present disclosure. FIG. 22 is a cross-sectional view taken along line E-E' of FIG. 21. FIG. 23 is a cross-sectional view taken along line F-F' of FIG. 21.

Figure 22:
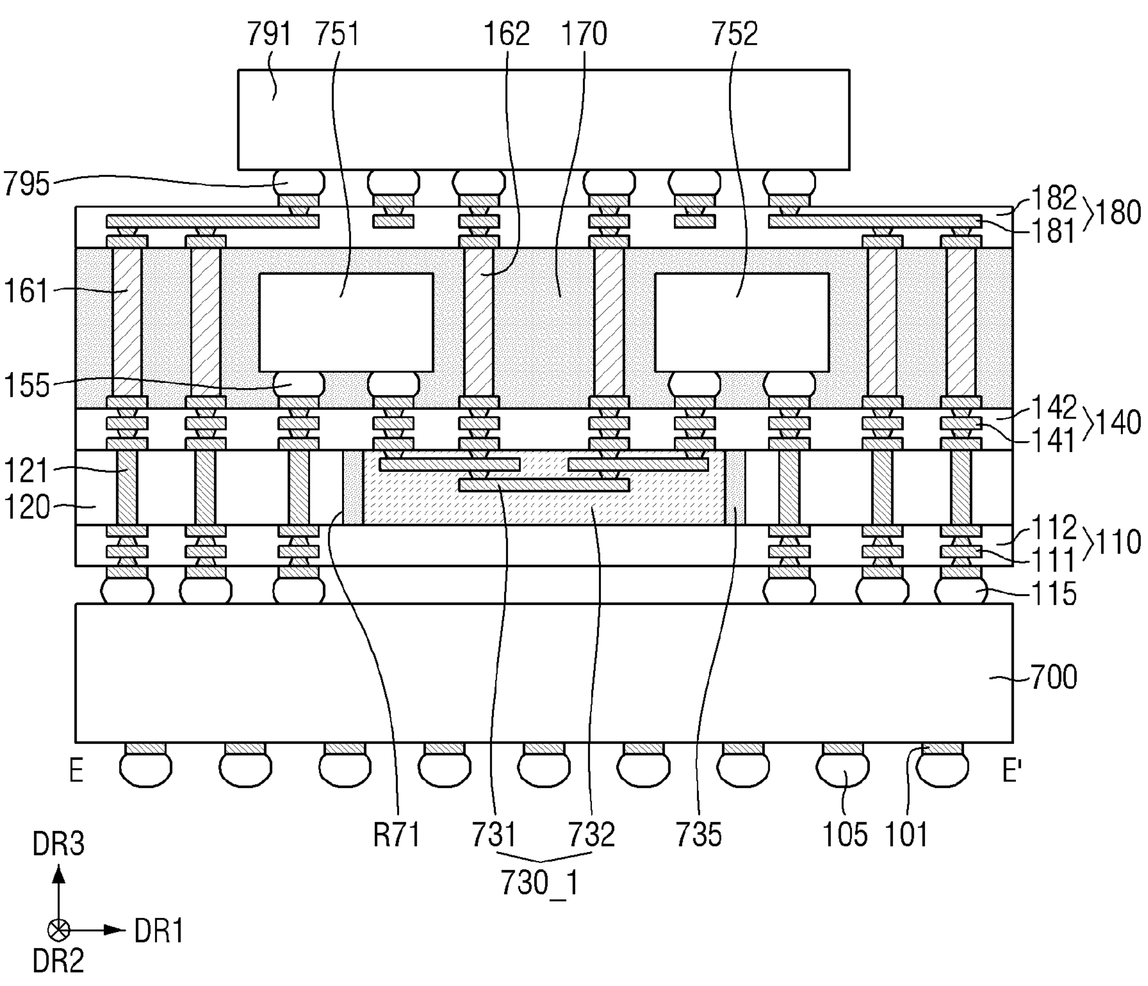
FIG. 22 is a cross-sectional view taken along line E-E' of FIG. 21.
Figure 23:
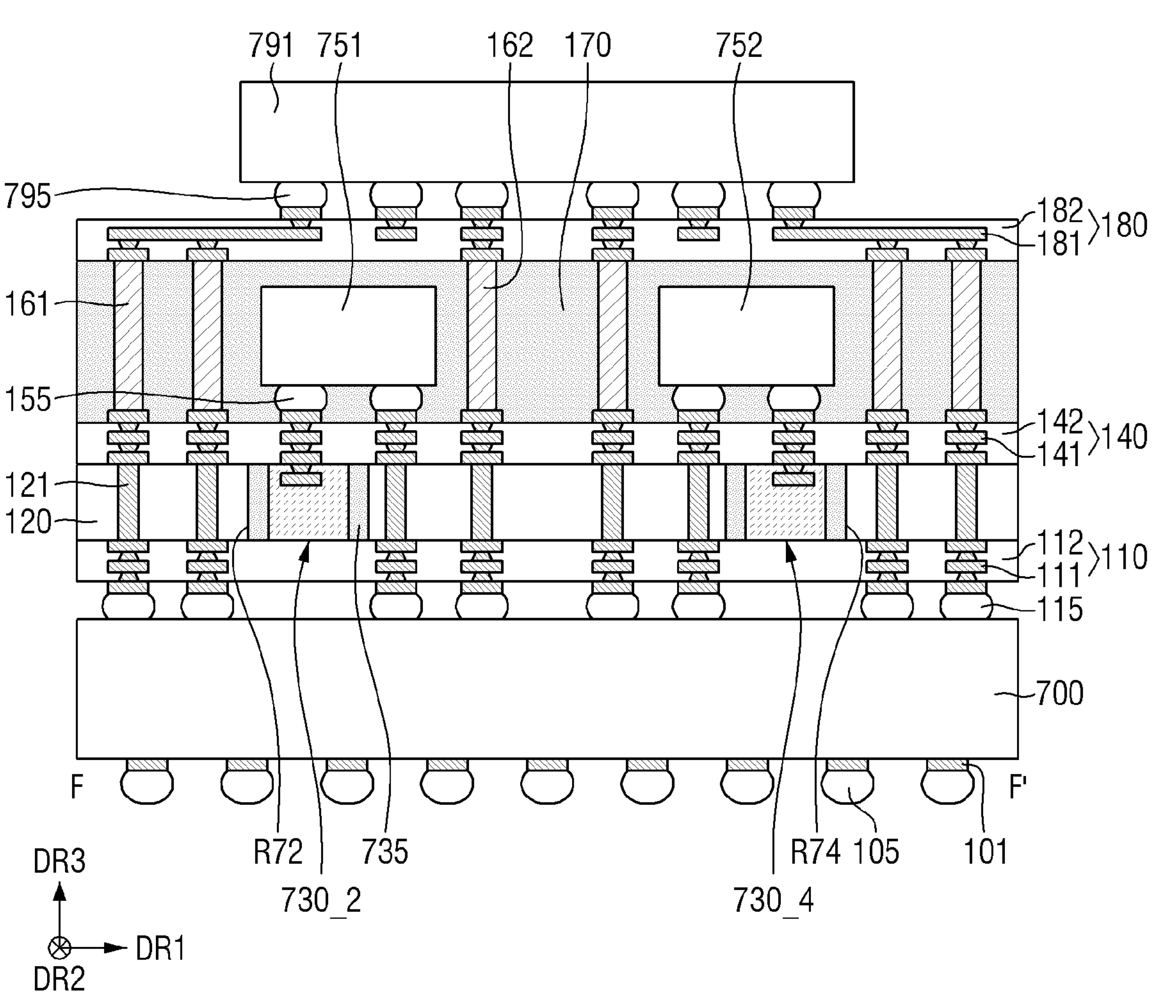
FIG. 23 is a cross-sectional view taken along line F-F' of FIG. 21.

Referring to FIGS. 21 to 23, in the semiconductor package according to some embodiments of the present disclosure, four connection structures 730_1, 730_2, 730_3 and 730_4 may be disposed on a substrate 700, four lower semiconductor chips 751, 752, 753 and 754 may be disposed on the four connection structures 730_1, 730_2, 730_3 and 730_4, and one upper semiconductor chip 791 may be disposed on the four lower semiconductor chips 751, 752, 753 and 754.

For example, each of the first to fourth lower semiconductor chips 751, 752, 753 and 754 may be disposed on the upper surface of the second redistribution structure 140. The second lower semiconductor chip 752 may be spaced apart from the first lower semiconductor chip 751 in the first horizontal direction DR1. The third lower semiconductor chip 753 may be spaced apart from the first lower semiconductor chip 751 in the second horizontal direction DR2. The fourth lower semiconductor chip 754 may be spaced apart from the third lower semiconductor chip 753 in the first horizontal direction DR1. The fourth lower semiconductor chip 754 may be spaced apart from the second lower semiconductor chip 752 in the second horizontal direction DR2.

A first recess R71 may extend lengthwise in the first horizontal direction DR1 inside the interposer 120. The first recess R71 may be formed below each of the first lower semiconductor chip 751 and the second lower semiconductor chip 752. A second recess R72 may extend lengthwise in the second horizontal direction DR2 inside the interposer 120. The second recess R72 may be formed below each of the first lower semiconductor chip 751 and the third lower semiconductor chip 753. A third recess R73 may extend lengthwise in the first horizontal direction DR1 inside the interposer 120. The third recess R73 may be formed below each of the third lower semiconductor chip 753 and the fourth lower semiconductor chip 754. A fourth recess R74 may extend lengthwise in the second horizontal direction DR2 inside the interposer 120. The fourth recess R74 may be formed below each of the second lower semiconductor chip 752 and the fourth lower semiconductor chip 754. The first to fourth recesses R71 to R74 may be spaced apart from each other.

For example, the first connection structure 730_1 may be disposed inside the first recess R71. The first connection structure 730_1 may extend in the first horizontal direction DR1. The first connection structure 730_1 may overlap each of the first lower semiconductor chip 751 and the second lower semiconductor chip 752 in the vertical direction DR3. The first connection structure 730_1 may be electrically connected to each of the first lower semiconductor chip 751 and the second lower semiconductor chip 752 through the second redistribution structure 140.

The second connection structure 730_2 may be disposed inside the second recess R72. The second connection structure 730_2 may extend in the second horizontal direction DR2. The second connection structure 730_2 may overlap each of the first lower semiconductor chip 751 and the third lower semiconductor chip 753 in the vertical direction DR3. The second connection structure 730_2 may be electrically connected to each of the first lower semiconductor chip 751 and the third lower semiconductor chip 753 through the second redistribution structure 140.

The third connection structure 730_3 may be disposed inside the third recess. The third connection structure 730_3 may extend in the first horizontal direction DR1. The third connection structure 730_3 may overlap each of the third lower semiconductor chip 753 and the fourth lower semiconductor chip 754 in the vertical direction DR3. The third connection structure 730_3 may be electrically connected to each of the third lower semiconductor chip 753 and the fourth lower semiconductor chip 754 through the second redistribution structure 140.

The fourth connection structure 730_4 may be disposed inside the fourth recess R74. The fourth connection structure 730_4 may extend in the second horizontal direction DR2. The fourth connection structure 730_4 may overlap each of the second lower semiconductor chip 752 and the fourth lower semiconductor chip 754 in the vertical direction DR3. The fourth connection structure 730_4 may be electrically connected to each of the second lower semiconductor chip 752 and the fourth lower semiconductor chip 754 through the second redistribution structure 140.

The first to fourth connection structures 730_1 to 730_4 may be spaced apart from each other. A first molding layer 735 may be disposed between each of the first to fourth connection structures 730_1 to 730_4 and the interposer 120. Each of the first to fourth connection structures 730_1 to 730_4 may include a base material layer 732 and a connection wiring pattern 731 disposed inside the base material layer 732.

For example, the first upper semiconductor chip 791 may be disposed on the upper surface of the third redistribution structure 180. The first upper semiconductor chip 791 may overlap each of the first to fourth lower semiconductor chips 751, 752, 753 and 754 in the vertical direction DR3. The first upper semiconductor chip 791 may overlap each of the first to fourth connection structures 730_1 to 730_4 in the vertical direction DR3. The first upper semiconductor chip 791 may be connected to the upper surface of the third redistribution structure 180 by using a fourth solder ball 795.

For example, the first upper semiconductor chip 791 may be electrically connected to the interposer 120 through the fourth solder ball 795, the third redistribution structure 180, the first post 161 and the second redistribution structure 140. The first upper semiconductor chip 791 may be electrically connected to each of the first to fourth lower semiconductor chips 751, 752, 753 and 754 through the fourth solder ball 795, the third redistribution structure 180, the second post 162, the second redistribution structure 140 and the first to fourth connection structures 730_1 to 730_4.

Although the embodiments of the present disclosure have been described with reference to the accompanying drawings, it will be apparent to those skilled in the art that the present disclosure can be manufactured in various forms without being limited to the above-described embodiments and can be embodied in other specific forms without departing from the spirit and essential characteristics of the present disclosure. Thus, the above embodiments are to be considered in all respects as illustrative and not restrictive.

What is claimed is:

1. A semiconductor package comprising:

a substrate;

an interposer disposed on the substrate;

a recess recessed from an upper surface of the interposer toward the inside of the interposer;

a connection structure disposed inside the recess;

a first post extending in a vertical direction that is perpendicular to an upper surface of the substrate and disposed on the upper surface of the interposer, wherein the first post is electrically connected to the interposer;

a second post extending in the vertical direction and disposed on an upper surface of the connection structure, wherein the second post is electrically connected to the connection structure;

a first lower semiconductor chip disposed in a space between the first post and the second post and disposed on the upper surface of the interposer and the upper surface of the connection structure, wherein the first lower semiconductor chip is electrically connected to the second post through the connection structure; and a first upper semiconductor chip disposed on an upper surface of the first lower semiconductor chip, wherein the first upper semiconductor chip is electrically connected to the first lower semiconductor chip through the second post and the connection structure.

2. The semiconductor package of claim 1, further comprising:

a first redistribution structure disposed between the first lower semiconductor chip and the upper surface of each of the interposer and the connection structure, wherein the first redistribution structure is electrically connected to each of the first post, the second post, the interposer, the connection structure and the first lower semiconductor chip.

3. The semiconductor package of claim 1, wherein the upper surface of the interposer and the upper surface of the connection structure are coplanar with each other.

4. The semiconductor package of claim 1, wherein a lower surface of the interposer and a lower surface of the connection structure are coplanar with each other.

5. The semiconductor package of claim 1, wherein the connection structure is spaced apart from the interposer in a first horizontal direction that is parallel to the upper surface of the substrate.

6. The semiconductor package of claim 5, further comprising:

a molding layer disposed inside the recess and in a space between the connection structure and the interposer, wherein an upper surface of the molding layer is coplanar with the upper surface of the interposer, and wherein a lower surface of the molding layer is coplanar with a lower surface of the interposer.

7. The semiconductor package of claim 1, further comprising:

a second redistribution structure disposed in a space between the first upper semiconductor chip and the upper surface of the first lower semiconductor chip, wherein the second redistribution structure is electrically connected to each of the first post, the second post and the first upper semiconductor chip.

8. The semiconductor package of claim 1, wherein the connection structure includes:

a base material layer including silicon, and a connection wiring pattern disposed inside the base material layer and electrically connected to each of the first lower semiconductor chip and the second post, and wherein the connection wiring pattern includes a conductive material.

9. The semiconductor package of claim 1, wherein the interposer contacts a sidewall and a lower surface of the connection structure, and wherein the connection structure includes a conductive material.

10. The semiconductor package of claim 1, further comprising:

a second lower semiconductor chip disposed on the upper surface of the interposer and the upper surface of the connection structure, wherein the second lower semiconductor chip is spaced apart from the first lower semiconductor chip in a first horizontal direction that is parallel to the upper surface of the substrate, wherein the second lower semiconductor chip is electrically connected to the second post through the connection structure, and wherein the second post is disposed in a space between the first lower semiconductor chip and the second lower semiconductor chip.

11. The semiconductor package of claim 10, further comprising:

a third post extending in the vertical direction and disposed on the upper surface of the connection structure, wherein the third post is electrically connected to the connection structure, and wherein the third post is disposed between the second post and the second lower semiconductor chip;

a second upper semiconductor chip disposed on an upper surface of the second lower semiconductor chip, wherein the second upper semiconductor chip is spaced apart from the first upper semiconductor chip in the first horizontal direction, and wherein the second upper semiconductor chip is electrically connected to each of the first lower semiconductor chip and the second lower semiconductor chip through the third post and the connection structure.

12. The semiconductor package of claim 11, further comprising:

a third upper semiconductor chip spaced apart from the first upper semiconductor chip in the first horizontal direction, wherein the third upper semiconductor chip overlaps the first post in the vertical direction, and wherein the third upper semiconductor chip is electrically connected to the first post.

13. The semiconductor package of claim 10, wherein the first upper semiconductor chip overlaps each of the first and second lower semiconductor chips in the vertical direction, and wherein the first upper semiconductor chip is electrically connected to each of the first and second lower semiconductor chips through the second post and the connection structure.

14. A semiconductor package comprising:

a substrate;

an interposer disposed on the substrate;

a recess recessed from an upper surface of the interposer toward the inside of the interposer;

a connection structure disposed inside the recess, wherein the connection structure is spaced apart from the interposer in a first horizontal direction that is parallel to an upper surface of the substrate;

a first molding layer disposed inside the recess, wherein the first molding layer is disposed in a space between the interposer and the connection structure;

a first redistribution structure disposed on each of the upper surface of the interposer and an upper surface of the connection structure, wherein the first redistribution structure is electrically connected to each of the interposer and the connection structure;

a first lower semiconductor chip disposed on an upper surface of the first redistribution structure, wherein the first lower semiconductor chip overlaps each of the interposer and the connection structure in a vertical direction that is perpendicular to the upper surface of the substrate, and wherein the first lower semiconductor chip is electrically connected to the connection structure through the first redistribution structure;

a second lower semiconductor chip disposed on the upper surface of the first redistribution structure, wherein the second lower semiconductor chip is spaced apart from the first lower semiconductor chip in the first horizontal direction, wherein the second lower semiconductor chip overlaps each of the interposer and the connection structure in the vertical direction, and wherein the second lower semiconductor chip is electrically connected to the connection structure through the first redistribution structure;

a post disposed on the upper surface of the first redistribution structure, wherein the post is disposed in a space between the first lower semiconductor chip and the second lower semiconductor chip, wherein the post extends in the vertical direction, and wherein the post is electrically connected to the connection structure through the first redistribution structure; and a first upper semiconductor chip disposed on an upper surface of the first lower semiconductor chip, wherein the first upper semiconductor chip is electrically connected to the first lower semiconductor chip through the post and the connection structure.

15. The semiconductor package of claim 14, further comprising:

a second molding layer disposed on the upper surface of the first redistribution structure and surrounding a sidewall of each of the first lower semiconductor chip, the second lower semiconductor chip, and the post, wherein an upper surface of the second molding layer is higher than each of the upper surface of the first lower semiconductor chip and an upper surface of the second lower semiconductor chip; and a second redistribution structure disposed between the first upper semiconductor chip and the upper surface of the second molding layer, wherein the second redistribution structure is electrically connected to the post.

16. The semiconductor package of claim 14, further comprising:

a second upper semiconductor chip disposed on an upper surface of the second lower semiconductor chip, wherein the second upper semiconductor chip is spaced apart from the first upper semiconductor chip in the first horizontal direction, and wherein the second upper semiconductor chip is electrically connected to the second lower semiconductor chip through the post and the connection structure.

17. The semiconductor package of claim 14, further comprising:

a first stack insulating layer disposed on the upper surface of the first redistribution structure and surrounding a sidewall of each of the first and second lower semiconductor chips, wherein the first stack insulating layer is spaced apart from the sidewall of each of the first and second lower semiconductor chips in the first horizontal direction;

a second stack insulating layer disposed on the first stack insulating layer and surrounding the sidewall of each of the first and second lower semiconductor chips, wherein the second stack insulating layer is spaced apart from the sidewall of each of the first and second lower semiconductor chips in the first horizontal direction; and a second molding layer disposed on the upper surface of the first redistribution structure, wherein the second molding layer surrounds each of the first lower semiconductor chip and the second lower semiconductor chip, and wherein the second molding layer covers a sidewall of each of the first stack insulating layer and the second stack insulating layer and an upper surface of the second stack insulating layer, wherein the post passes through each of the first stack insulating layer and the second stack insulating layer in the vertical direction.

18. The semiconductor package of claim 14, further comprising:

a third lower semiconductor chip disposed on the upper surface of the first redistribution structure, wherein the third lower semiconductor chip is spaced apart from the first lower semiconductor chip in a second horizontal direction that is parallel to the upper surface of the substrate and perpendicular to the first horizontal direction, wherein the third lower semiconductor chip overlaps each of the interposer and the connection structure in the vertical direction, and wherein the third lower semiconductor chip is electrically connected to the first upper semiconductor chip through the first redistribution structure and the connection structure; and a fourth lower semiconductor chip disposed on the upper surface of the first redistribution structure, wherein the fourth lower semiconductor chip is spaced apart from the third lower semiconductor chip in the first horizontal direction, wherein the fourth lower semiconductor chip overlaps each of the interposer and the connection structure in the vertical direction, and wherein the fourth lower semiconductor chip is electrically connected to the first upper semiconductor chip through the first redistribution structure and the connection structure.

19. The semiconductor package of claim 18, wherein the connection structure includes:

a first connection structure overlapping each of the first and second lower semiconductor chips in the vertical direction and extending in the first horizontal direction, a second connection structure overlapping each of the first and third lower semiconductor chips in the vertical direction and extending in the second horizontal direction, a third connection structure overlapping each of the third and fourth lower semiconductor chips in the vertical direction and extending in the first horizontal direction, and a fourth connection structure overlapping each of the second and fourth lower semiconductor chips in the vertical direction and extending in the second horizontal direction, and wherein the first to fourth connection structures are spaced apart from each other.

20. A semiconductor package comprising:

a substrate;

an interposer disposed on the substrate;

a recess recessed from an upper surface of the interposer toward the inside of the interposer;

a connection structure disposed inside the recess, wherein the connection structure is spaced apart from the interposer in a first horizontal direction that is parallel to an upper surface of the substrate and includes a base material layer and a connection wiring pattern disposed inside the base material layer, and wherein the base material layer includes silicon, and the connection wiring pattern includes a conductive material;

a first molding layer disposed inside the recess and disposed in a space between the interposer and the connection structure, wherein an upper surface of the first molding layer is coplanar with the upper surface of the interposer, and wherein a lower surface of the first molding layer is coplanar with a lower surface of the interposer;

a first redistribution structure disposed on each of the upper surface of the interposer and an upper surface of the connection structure, wherein the first redistribution structure is electrically connected to each of the interposer and the connection structure;

a first post extending in a vertical direction that is perpendicular to the upper surface of the substrate and disposed on an upper surface of the first redistribution structure, wherein the first post is electrically connected to the interposer through the first redistribution structure;

a second post extending in the vertical direction and disposed on the upper surface of the first redistribution structure, wherein the second post is electrically connected to the connection structure through the first redistribution structure;

a first lower semiconductor chip disposed on the upper surface of the first redistribution structure, wherein the first lower semiconductor chip is disposed between the first post and the second post, and wherein the first lower semiconductor chip is electrically connected to the second post through the first redistribution structure and the connection structure;

a second lower semiconductor chip disposed on the upper surface of the first redistribution structure, wherein the second lower semiconductor chip is spaced apart from the second post in the first horizontal direction, and wherein the second lower semiconductor chip is electrically connected to the second post through the first redistribution structure and the connection structure;

a second molding layer surrounding each of the first lower semiconductor chip and the second lower semiconductor chip, wherein the first post and the second post penetrate the second molding layer, and wherein an upper surface of the second molding layer is higher than an upper surface of each of the first and second lower semiconductor chips;

a second redistribution structure disposed on the upper surface of the second molding layer, wherein the second redistribution structure is electrically connected to each of the first post and the second post; and an upper semiconductor chip disposed on an upper surface of the second redistribution structure, wherein the upper semiconductor chip is electrically connected to the first lower semiconductor chip through the second redistribution structure, the second post and the connection structure.

* * * * *